(12) United States Patent
Glass et al.

(10) Patent No.: US 11,101,350 B2
(45) Date of Patent: *Aug. 24, 2021

(54) INTEGRATED CIRCUIT WITH GERMANIUM-RICH CHANNEL TRANSISTORS INCLUDING ONE OR MORE DOPANT DIFFUSION BARRIER ELEMENTS

(71) Applicant: INTEL CORPORATION, Santa Clara, CA (US)

(72) Inventors: Glenn A. Glass, Portland, OR (US); Anand S. Murthy, Portland, OR (US); Karthik Jambunathan, Hillsboro, OR (US); Benjamin Chu-Kung, Portland, OR (US); Seung Hoon Sung, Portland, OR (US); Jack T. Kavalieros, Portland, OR (US); Tahir Ghani, Portland, OR (US); Harold W. Kennel, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/930,627

(22) Filed: May 13, 2020

(65) Prior Publication Data

US 2020/0273952 A1     Aug. 27, 2020

Related U.S. Application Data

(63) Continuation of application No. 16/474,446, filed as application No. PCT/US2017/025644 on Apr. 1, 2017, now Pat. No. 10,692,973.

(51) Int. Cl.
*H01L 27/00* (2006.01)
*H01L 29/00* (2006.01)
(Continued)

(52) U.S. Cl.
CPC .... *H01L 29/1033* (2013.01); *H01L 21/02527* (2013.01); *H01L 21/02532* (2013.01);
(Continued)

(58) Field of Classification Search
CPC ......... H01L 21/02532; H01L 21/02603; H01L 21/02527; H01L 21/823821;
(Continued)

(56) References Cited

U.S. PATENT DOCUMENTS

| 6,607,948 B1 | 8/2003 | Sugiyama et al. |
| 6,713,810 B1 | 3/2004 | Bhattacharyya |

(Continued)

FOREIGN PATENT DOCUMENTS

| WO | 2018182748 A1 | 10/2018 |
| WO | 2018182749 A1 | 10/2018 |

OTHER PUBLICATIONS

International Search Report and Written Opinion received for PCT/US2017/025643, dated Jan. 18, 2018. 12 pages.
(Continued)

*Primary Examiner* — Nikolay K Yushin
(74) *Attorney, Agent, or Firm* — Schwabe, Williamson & Wyatt, P.C.

(57) ABSTRACT

Techniques are disclosed for forming germanium (Ge)-rich channel transistors including one or more dopant diffusion barrier elements. The introduction of one or more dopant diffusion elements into at least a portion of a given source/drain (S/D) region helps inhibit the undesired diffusion of dopant (e.g., B, P, or As) into the adjacent Ge-rich channel region. In some embodiments, the elements that may be included in a given S/D region to help prevent the undesired dopant diffusion include at least one of tin and relatively high silicon. Further, in some such embodiments, carbon may also be included to help prevent the undesired dopant (Continued)

diffusion. In some embodiments, the one or more dopant diffusion barrier elements may be included in an interfacial layer between a given S/D region and the Ge-rich channel region and/or throughout at least a majority of a given S/D region. Numerous embodiments, configurations, and variations will be apparent.

19 Claims, 10 Drawing Sheets

(51) Int. Cl.
*H01L 29/10* (2006.01)
*H01L 21/02* (2006.01)
*H01L 21/22* (2006.01)
*H01L 21/768* (2006.01)
*H01L 21/8238* (2006.01)
*H01L 27/092* (2006.01)
*H01L 29/423* (2006.01)
*H01L 29/66* (2006.01)
*H01L 29/78* (2006.01)

(52) U.S. Cl.
CPC .. *H01L 21/02535* (2013.01); *H01L 21/02603* (2013.01); *H01L 21/22* (2013.01); *H01L 21/76871* (2013.01); *H01L 21/823807* (2013.01); *H01L 21/823814* (2013.01); *H01L 21/823821* (2013.01); *H01L 21/823871* (2013.01); *H01L 27/0924* (2013.01); *H01L 29/42392* (2013.01); *H01L 29/66545* (2013.01); *H01L 29/66795* (2013.01); *H01L 29/785* (2013.01); *H01L 29/7848* (2013.01)

(58) Field of Classification Search
CPC ......... H01L 21/76871; H01L 21/02535; H01L 21/22; H01L 21/823807; H01L 21/823871; H01L 21/823814; H01L 27/0924; H01L 27/092; H01L 27/0886; H01L 27/088; H01L 27/1104; H01L 27/0617; H01L 29/161; H01L 29/165; H01L 29/42392; H01L 29/66545; H01L 29/7848; H01L 29/1033; H01L 29/66795; H01L 29/785; H01L 29/7391; H01L 29/41791; B82Y 10/00; B82Y 99/00
See application file for complete search history.

(56) References Cited

U.S. PATENT DOCUMENTS

| | | | |
|---|---|---|---|
| 7,504,691 B2* | 3/2009 | Park | H01L 29/66734 257/329 |
| 7,531,393 B2 | 5/2009 | Doyle et al. | |
| 7,670,934 B1 | 3/2010 | Pal et al. | |
| 8,994,104 B2 | 3/2015 | Glass et al. | |
| 9,117,791 B2 | 8/2015 | Glass et al. | |
| 9,437,691 B2 | 9/2016 | Glass et al. | |
| 9,966,471 B2* | 5/2018 | Ching | H01L 29/0673 |
| 10,347,581 B2 | 7/2019 | Gluschenkov et al. | |
| 2006/0289916 A1* | 12/2006 | Park | H01L 29/66734 257/296 |
| 2007/0048907 A1 | 3/2007 | Lee et al. | |
| 2008/0042209 A1 | 2/2008 | Tan et al. | |
| 2013/0248999 A1 | 9/2013 | Glass et al. | |
| 2013/0264639 A1 | 10/2013 | Glass et al. | |
| 2014/0091279 A1 | 4/2014 | Kachian et al. | |
| 2014/0103331 A1 | 4/2014 | Cheng et al. | |
| 2014/0167108 A1 | 6/2014 | Rachmady et al. | |
| 2015/0091099 A1 | 4/2015 | Ching et al. | |
| 2015/0228755 A1 | 8/2015 | Wei et al. | |
| 2016/0240681 A1* | 8/2016 | Ching | H01L 29/66545 |
| 2017/0012124 A1 | 1/2017 | Glass | |
| 2018/0277483 A1 | 9/2018 | Gluschenkov et al. | |
| 2019/0348500 A1 | 11/2019 | Glass et al. | |
| 2019/0348501 A1 | 11/2019 | Glass et al. | |

OTHER PUBLICATIONS

International Search Report and Written Opinion received for PCT/US2017/025644, dated Jan. 10, 2018. 12 pages.
International Preliminary Report on Patentability received for PCT/US2017/025643, dated Oct. 10, 2019. 9 pages.
International Preliminary Report on Patentability received for PCT/US2017/025644, dated Oct. 10, 2019. 9 pages.

* cited by examiner

_US 11,101,350 B2_

INTEGRATED CIRCUIT WITH GERMANIUM-RICH CHANNEL TRANSISTORS INCLUDING ONE OR MORE DOPANT DIFFUSION BARRIER ELEMENTS

CROSS-REFERENCE TO RELATED APPLICATIONS

This patent application is Continuation of U.S. patent application Ser. No. 16/474,446, filed on Jun. 27, 2019, which is a U.S. National Phase Application under 35 U.S.C. § 371 of International Application No. PCT/US2017/025644, filed on Apr. 1, 2017, the entire contents of which is hereby incorporated by reference herein.

BACKGROUND

Semiconductor devices are electronic components that exploit the electronic properties of semiconductor materials, such as silicon (Si), germanium (Ge), and silicon germanium (SiGe). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. In instances where the charge carriers are electrons, the FET is referred to as an n-channel device, and in instances where the charge carriers are holes, the FET is referred to as a p-channel device. Standard dopant used for Si, Ge, and SiGe includes boron (B) for p-type (acceptor) dopant and phosphorous (P) or arsenic (As) for n-type (donor) dopant. Some FETs have a fourth terminal called the body or substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (p-MOS) and n-channel MOSFET (n-MOS) to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin). A nanowire transistor (sometimes referred to as a gate-all-around (GAA) or nanoribbon transistor) is configured similarly to a fin-based transistor, but instead of a finned channel region where the gate is on three portions (and thus, there are three effective gates), one or more nanowires are used for the channel region and the gate material generally surrounds each nanowire.

BRIEF DESCRIPTION OF THE DRAWINGS

FIG. 2C' is a blown-out portion of FIG. 2C illustrating alternative recess and replace processing to form a replacement material fin, in accordance with some embodiments.

FIG. 2D' is a blown-out portion of FIG. 2D illustrating the replacement material fin from FIG. 2C' after the shallow trench isolation (STI) material has been recessed to expose the replacement material fin, in accordance with some embodiments.

FIG. 2G" is a blown-out portion of FIG. 2G', illustrating an alternative S/D region that may be formed, in accordance with some embodiments.

FIG. 3C' is a blown-out portion of FIG. 3C illustrating a graded dopant diffusion barrier layer, in accordance with some embodiments.

FIG. 3C" is a blown-out portion of FIG. 3C illustrated a multilayer dopant diffusion barrier layer including a first layer and a second layer, where the second layer is graded, in accordance with some embodiments

Figure 1:
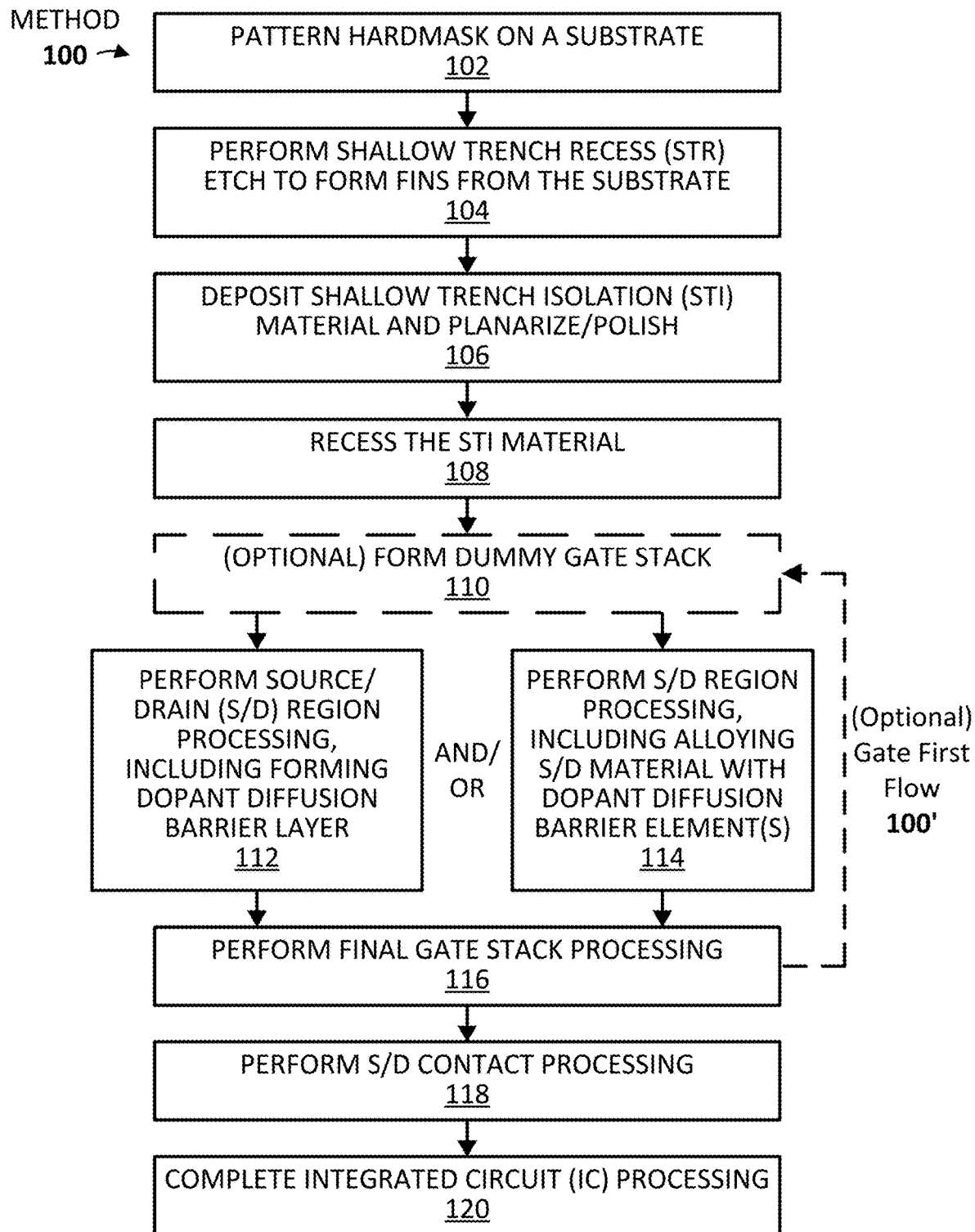
FIG. 1 illustrates a method of forming an integrated circuit (IC) including at least one germanium (Ge)-rich channel transistor employing one or more dopant diffusion barrier elements, specifically, to help prevent source/drain (S/D) dopant from diffusing into a corresponding channel region, in accordance with some embodiments of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually differentiating the different features. In short, the figures are provided merely to show example structures.

DETAILED DESCRIPTION

When epitaxially grown silicon germanium (SiGe) or germanium (Ge) source/drain (S/D) regions are employed to, for example, increase on-state current flow (carrier mobility) in a SiGe or Ge channel transistor, there is a strong driving force for the dopant included in the S/D regions to diffuse into the channel region. Such a strong driving force may be exacerbated due to the abrupt interface formed between a given S/D region, which is generally heavily doped, and the corresponding channel region, which is generally lightly doped in an opposite manner than the S/D region or undoped. If the dopant (e.g., B, P, or As) diffuses from the S/D region into the channel region, the effective channel length becomes shorter, which is undesirable. For instance, instead of the effective channel length being defined by the gate length (e.g., as is the case for self-aligned configurations), which is the length of the gate electrode above the channel region, when dopant diffuses from one or both of the S/D regions into the channel region, the effective channel length becomes relatively smaller than the gate length, which is generally referred to as short channel effects. Such short channel effects are undesirable, as they lead to higher off-state current flow (e.g., from source to drain) and low threshold gate voltage (Vt), both of which degrade the overall transistor performance, and in some cases, can render the transistor inoperable. For example, a major impediment to Ge-rich channel CMOS is the extremely high diffusion rate of n-type dopant (e.g., P or As) in such Ge-rich material. For instance, Ge-rich channel n-MOS devices are susceptible to spilling of the n-type dopant from the S/D regions into the channel region, which can cause the device to have trouble shutting current off, or worse, cause the device to electrically short and thus be inoperable. The issues caused by short channel effects as a result of dopant diffusion are further exacerbated as transistor devices are scaled down to include smaller and smaller critical dimensions, such as transistor devices including lateral gate lengths (between corresponding S/D regions) that are, for example, sub-50 nm.

Thus, and in accordance with numerous embodiments of the present disclosure, techniques are provided for forming Ge-rich channel transistors including one or more dopant diffusion barrier elements. As can be understood based on this disclosure, the introduction of one or more dopant diffusion elements into at least a portion of a given S/D region helps inhibit the undesired diffusion of dopant (e.g., B, P, or As) into the adjacent Ge-rich channel region. In some embodiments, the elements that may be included in a given S/D region to help prevent the undesired dopant diffusion include at least one of tin and relatively high silicon (e.g., relative to the channel region or just relatively high in general, such as Si-rich material). Further, in some such embodiments, carbon may also be included to help prevent the undesired dopant diffusion. In some embodiments, the one or more dopant diffusion barrier elements may be: included in an interfacial layer located between a given S/D region and its corresponding Ge-rich channel region, where that interfacial layer acts as a dopant diffusion barrier layer to help prevent dopant included in the bulk S/D material from diffusing into the Ge-rich channel region; alloyed into the bulk S/D material, such that the one or more dopant diffusion barrier elements are included throughout at least a majority of a given S/D region; or utilized in a combination of the two aforementioned approaches.

In some embodiments, the techniques described herein enable the ability to use Ge-rich channel material for n-MOS devices, as the dopant diffusion (e.g., As or P diffusion) issue would otherwise be unmanageable, leading to shorting of the device. For instance, in some such embodiments, use of one or more dopant diffusion barrier elements as described herein can curtail diffusion from a given S/D region to its corresponding Ge-rich channel region to insignificant or undetectable levels. In some embodiments, the techniques can reduce dopant diffusion for Ge-rich channel p-MOS devices, thereby achieving increased on-state current as well as improved short channel effects. For instance, in some such embodiments, dopant diffusion (e.g., B diffusion) may be reduced (improved) by 1.5 nm or greater from a given S/D region into its corresponding Ge-rich channel region with standard thermal treatments used post S/D formation. When accounting for that improvement for both S/D regions, the effective channel length can be increased by 3 nm or greater, depending on the particular configuration, which is a significant improvement in short channel effects for, e.g., sub-50 nm gate length transistor devices. Numerous other benefits will be apparent in light of the dopant diffusion barrier techniques described herein, such as being able to reduce dopant diffusivity into a Ge-rich channel region by at least 0.5-5 orders of magnitude all the way up to essentially reducing all undesired dopant from diffusing into the Ge-rich channel region.

Note that, as used herein, "Ge-rich" includes Ge or SiGe with at least 50% Ge by atomic percentage, where the Ge or SiGe may be doped with any suitable material(s) and/or alloyed with other group IV elements (e.g., carbon and/or tin). For instance, in some embodiments, the Ge-rich material may be n-type doped, such as Ge:As, Ge:P, SiGe:P (with at least 50% Ge by atomic percentage), or SiGe:As (with at least 50% Ge by atomic percentage), to provide some examples. Further, in some embodiments, the Ge-rich material may include alloying of carbon and/or tin, such as Ge:C, GeSn, SiGe:C, SiGeSn, GeSn:C, SiGeSn:C. Also note, that in some embodiments, Ge-rich may include a different threshold concentration (by atomic percentage) of Ge, such as at least 55, 60, 65, 70, 75, 80, 85, 90, or 95%, for example. For instance, in some applications, embodiments where a Ge-rich channel region of a transistor includes at least 80% Ge by atomic percentage may be desired, such as to achieve a desired charge carrier mobility, for example. Further note that the inclusion of Ge-rich material in a given feature as described herein does not preclude the inclusion of other material (i.e., non-Ge-rich material) from also being included. For instance, in some embodiments, a Ge-rich channel region may include a multilayer structure that includes at least one Ge-rich layer and at least one non-Ge-rich layer. However, in other embodiments, a Ge-rich feature has Ge-rich material be throughout essentially the entirety of that feature. Moreover, a Ge-rich channel region may include grading of the concentration of Ge throughout at least a portion of the channel region, such that there may be one or more portions of that channel region that include less than 50% Ge concentration by atomic percentage, and may even include no Ge content at all.

Also, as used herein, "group IV semiconductor material" (or "group IV material" or generally, "IV") includes at least one group IV element (e.g., silicon, germanium, carbon, tin), such as silicon (Si), germanium (Ge), silicon germanium (SiGe), and so forth. Note that alloys of group IV elements are not to be confused with compounds of those elements. Therefore, when carbon is alloyed with any of the other group IV elements, the resulting alloy will be expressed herein as "X:C", where "X" is the group IV element or alloy and ":C" indicates alloying with carbon. For instance, silicon alloyed with carbon may be referred to herein as Si:C (thereby preventing confusion with silicon carbide (SiC)), silicon germanium alloyed with carbon may be referred to herein as SiGe:C, germanium alloyed with carbon may be referred to herein as Ge:C (thereby preventing confusion with germanium carbide (GeC)), and so forth. Also note that the molecular ratio or the atomic percentage of the elements included in a group IV alloy can be adjusted as desired using techniques known to those in the art. Further note that the use of "X:Z" herein indicates a doping relationship where "X" is an element or alloy doped by "Z", such as boron-doped silicon being represented by Si:B, arsenic-doped silicon germanium being represented by SiGe:As, or phosphorous-doped silicon germanium carbon being represented by SiGe:C:P, to provide some examples. Generally, when referring to group IV semiconductor material as described herein (e.g., Si, SiGe, Ge, SiSn, SiGeSn, GeSn, Si:C, SiGe:C, Ge:C, SiSn:C, SiGeSn:C, GeSn:C), that group IV semiconductor material has a monocrystalline (or single-crystal) structure, unless otherwise stated, such as, for example, where polycrystalline silicon (or poly-Si) may be utilized, as stated herein.

In some embodiments, undesired dopant diffusion into a Ge-rich channel region may be reduced based on the relative concentration of Si in a given S/D region as compared to the Ge-rich channel region. For instance, for a SiGe S/D region, even relatively small increases in Si atomic percentage reduces the diffusivity of the dopant included in that S/D region. For example, for Ge channel transistors, such as Ge channel n-MOS, Ge S/D may be replaced with SiGe S/D to significantly reduce the amount of dopant (e.g., P or As) that diffuses into the Ge-rich channel region during subsequent processing after the n-type doped SiGe S/D is formed (e.g., during various thermal events, such as anneals, that occur post-S/D processing). In such an example case, even 10% greater Si concentration in a given SiGe S/D region can have a dopant diffusion barrier impact, such as in an example case of a Ge channel and a $Si_{0.1}Ge_{0.9}$ S/D (in other words, SiGe with 10% Si by atomic percentage). Thus, in some embodiments, a given S/D region may have relatively more Si concentration than its corresponding Ge-rich channel region to help prevent dopant diffusion from the given S/D region into the Ge-rich channel region.

In some such embodiments, the S/D region may include 10-100% more Si by atomic percentage than the corresponding Ge-rich channel. Further, in some such embodiments where the relative difference in Si concentration is used as a dopant diffusion barrier, a given S/D region may include at least 10, 15, 20, 25, 30, 35, 40, 45, 50, 60, 70, 80, or 90% more Si concentration by atomic percentage than the corresponding Ge-rich channel region. By way of example, if the S/D region included at least 20% more Si concentration (or at least 20% less Ge concentration) by atomic percentage than a corresponding Ge-rich channel region, in the case of a Ge channel, the given S/D region may include SiGe with at least 20% Si concentration by atomic percentage all the way up to Si (such that there is no significant Ge content in that S/D region), while in the case of a SiGe channel having 80% Ge concentration (and 20% Si concentration, or in other words, $Si_{0.2}Ge_{0.8}$), the given S/D region may include SiGe with at least 40% Si concentration by atomic percentage all the way up to Si (such that there is no significant Ge content in that S/D region). Note that in embodiments employing Si as a dopant diffusion barrier element (e.g., relatively higher Si content), it may be desired to have the relatively higher Si content in the bulk of a given S/D region such that it acts to lower the dopant diffusivity of that bulk S/D region, thereby making it less likely that dopant outwardly diffuses from the bulk S/D region into the adjacent channel region.

Generally, in some embodiments, a given S/D region (or at least a portion of a given S/D region) may be considered to be Si-rich, where "Si-rich" as used herein includes Si or SiGe with at least 50% Si by atomic percentage where the Si or SiGe may be doped with any suitable material(s) and/or alloyed with other group IV elements (e.g., carbon and/or tin). For instance, in some embodiments, the Si-rich material may be n-type doped, such as Si:As, Si:P, SiGe:P (with at least 50% Si by atomic percentage), or SiGe:As (with at least 50% Si by atomic percentage), to provide some examples. Further, in some embodiments, the Si-rich material may include alloying of carbon and/or tin, such as Si:C, SiSn, SiGe:C, SiGeSn, SiSn:C, SiGeSn:C. Also note, that in some embodiments, Si-rich may include a different threshold concentration (by atomic percentage) of Si, such as at least 55, 60, 65, 70, 75, 80, 85, 90, or 95%, for example. For instance, in some applications, embodiments where a Si-rich S/D includes at least 70% Si by atomic percentage may be desired, such as to achieve a desired dopant diffusion barrier benefit, for example. Further note that the inclusion of Si-rich material in a given feature as described herein does not preclude the inclusion of other material (i.e., non-Si-rich material) from also being included. For instance, in some embodiments, a Si-rich S/D region may include a multilayer structure, such as including a dopant diffusion barrier layer and a bulk S/D material region, as described herein, where one of the layer and the bulk material includes Si-rich material and one does not include Si-rich material. However, in other embodiments, a Si-rich feature has Si-rich material throughout essentially the entirety of that feature. Moreover, a Si-rich S/D region may include grading of the concentration of Si throughout at least a portion of the S/D region, such that there may be one or more portions of that S/D region that include less than 50% Si concentration by atomic percentage, and may even include no Si content at all.

In some embodiments, undesired dopant diffusion into a Ge-rich channel region may be reduced based on the inclusion of carbon into a corresponding S/D region, whether it be included as a carbon-based dopant diffusion barrier layer at the interface between the S/D region and the Ge-rich channel region, as a carbon alloy component included in at least a majority (or essentially the entirety) of the S/D region, or a combination of the two (e.g., a carbon-based interfacial dopant diffusion barrier layer coupled with alloying of carbon throughout at least a majority of the S/D region). Generally note that when a dopant diffusion barrier layer is described herein, whether it includes carbon, tin, and/or a relative difference in silicon content, the dopant diffusion barrier layer is located at least at the interface of a given S/D region and its corresponding Ge-rich channel region, such that the dopant diffusion barrier layer may or may not be considered a portion of that given S/D region. Regardless, the dopant diffusion barrier layer, in embodiments where present (as opposed to embodiments where the dopant diffusion barrier element is only a part of a given bulk S/D region), helps prevent dopant from undesirably diffusing into the Ge-rich channel region. Further note that in embodiments employing carbon as a dopant diffusion barrier element, it may be desired to include the carbon in a diffusion barrier layer as described herein, where such a carbon-based dopant diffusion barrier layer may be employed to essentially block the diffusion of dopant from a given S/D region into the channel region.

In embodiments where carbon is employed as a dopant diffusion barrier element in an interfacial layer between a given S/D region and its corresponding Ge-rich channel region, the carbon-based dopant diffusion barrier interfacial layer may include a thickness in the range of 0.5-10 nm (or in a subrange of 0.5-1, 0.5-2, 0.5-3, 0.5-5, 0.5-8, 1-2, 1-3, 1-5, 1-8, 1-10, 2-3, 2-5, 2-8, 2-10, 3-5, 3-8, 3-10, or 5-10 nm) or greater, for example. Further, in embodiments where carbon is employed as a dopant diffusion barrier element in an interfacial layer between a given S/D region and its corresponding Ge-rich channel region, the carbon-based dopant diffusion barrier layer includes non-carbon group IV semiconductor material alloyed with the carbon, such as Si:C, SiGe:C, Ge:C, SiSn:C, SiGeSn:C, or GeSn:C, for example. Thus, in some embodiments, the carbon concentration (by atomic percentage) included in a carbon-based interfacial dopant diffusion barrier layer may be in the range of 1E19 atoms per cubic cm to 20% by atomic percentage (or in a subrange of 1E19 atoms per cubic cm to 5%, 1E19 atoms per cubic cm to 10%, 1-5%, 1-10%, 1-20%, 2-5%, 2-10%, 2-20%, 5-10%, 5-20%, or 10-20%) or greater, for example. For instance, a carbon-based dopant diffusion barrier layer that includes silicon germanium alloyed with carbon and has a silicon concentration of 40% (by atomic percentage), a germanium concentration of 50% (by atomic percentage) and a carbon concentration of 10% (by atomic percentage) may be represented herein as $Si_{0.4}Ge_{0.5}:C_{0.1}$, to provide an example. In some embodiments, an interfacial dopant diffusion barrier layer (where employed at the interface of a given S/D region and its corresponding Ge-rich channel region) may include a relatively higher concentration of carbon and/or tin for relatively thinner layers, and vice versa, a relatively lower concentration of carbon and/or tin for relatively thicker layers, such that the concentration of the dopant barrier element(s) may be adjusted according to the thickness of the layer. Generally, where carbon is alloyed with two or more non-carbon group IV elements, such as with SiGe (e.g., as SiGe:C), any suitable concentrations of those two or more elements may be selected, unless explicitly stated otherwise. By way of example, SiGe:C with 5% carbon concentration by atomic percentage leaves 95% of atomic percentage for the Si and Ge components, such that the alloy may include up to 95% Si concentration (or up to 95% Ge concentration), for example.

In some embodiments, an interfacial dopant diffusion barrier layer (where employed at the interface of a given S/D region and its corresponding Ge-rich channel region) may include a multilayer structure and/or include grading (e.g., increasing and/or decreasing) of the concentration of at least one material component through at least a portion of the layer. For instance, in an example embodiment, a given carbon-based dopant diffusion barrier layer may be grown starting out with a relatively high carbon concentration followed by decreasing the carbon in the composition of the growth material until it is removed completely, such that the carbon concentration is graded and has the relatively highest concentration near the Ge-rich channel region and relatively lowest concentration near the remainder of the S/D region. In another example embodiment, a Si:C layer may be formed on the Ge-rich channel region followed by a graded SiGe layer (e.g., a SiGe:B layer, in the case of a p-type doped S/D region, such as for a p-MOS device) that increases the Ge concentration as it is grown. In yet another example embodiment, a Si:C layer may be formed on the Ge-rich channel region followed by a Si layer (e.g., a Si:B layer, in the case of a p-type doped S/D region) followed by formation of the bulk SiGe S/D material (e.g., SiGe:B, in the case of a p-type doped S/D region). In still another example embodiment, a SiGe:C layer may be formed on the Ge-rich channel region followed by the formation of the bulk SiGe S/D material (e.g., SiGe:P, in the case of an n-type doped S/D region, such as for an n-MOS device). Numerous different configurations and variations for employing dopant diffusion barrier elements for a Ge-rich channel region will be apparent in light of this disclosure.

In embodiments where carbon is alloyed into at least a majority of a given S/D region, such as alloying carbon throughout at least a majority of the bulk of the S/D region (regardless of whether a dopant diffusion barrier layer is employed), carbon may be present in at least 50, 60, 70, 80, 90, or 95% of the given S/D region. In some embodiments, where carbon is alloyed into at least a majority of a given S/D region, carbon may be throughout essentially the entirety of the S/D region. In embodiments where carbon is alloyed into at least a majority of a given S/D region, it may be alloyed in a concentration of 1E19 atoms per cubic cm to 5% by atomic percentage (or in a subrange of 1E19 atoms per cubic cm to 1%, 1E19 atoms per cubic cm to 2%, 1E19 atoms per cubic cm to 3%, 1E19 atoms per cubic cm to 4%, 1-2%, 1-3%, 1-4%, 1-5%, 2-3%, 2-4%, 2-5%, 3-4%, 3-5%, or 4-5%), so as to achieve dopant diffusion barrier benefits and thereby help prevent short channel effects, without undesirably sacrificing other transistor performance areas (such as adversely affecting S/D resistance). Note that in some embodiments, the dopant included in a given S/D region (e.g., B, P, or As) may be graded such that it is relatively lower in portions near the Ge-rich channel region than in other portions of the S/D region to help prevent dopant diffusion into the Ge-rich channel region. Such changes in the dopant concentration may achieved by grading the dopant during deposition of the S/D material (e.g., during in-situ processing) and/or including incremental increases as the material of the S/D region is grown. Also note that, in embodiments employing a dopant diffusion barrier layer as described herein, the S/D region is a replacement S/D region, as re-growing the S/D material provides the opportunity to first form the dopant diffusion barrier layer, as will be apparent in light of this disclosure. Thus, in such embodiments, the S/D material is not native to the substrate, as will also be apparent in light of this disclosure.

In some embodiments, undesired dopant diffusion into a Ge-rich channel region may be reduced based on the inclusion of tin into a corresponding S/D region, whether it be included as a tin-based dopant diffusion barrier layer at the interface between the S/D region and the Ge-rich channel region, as a tin alloy component included in at a majority (or essentially the entirety) of the S/D region, or a combination of the two (e.g., a tin-based interfacial dopant diffusion barrier layer coupled with alloying of tin throughout at least a majority of the S/D region). Recall that the dopant diffusion barrier layer (where employed) and/or the bulk material in the S/D region may also or alternatively include carbon and/or relatively increased Si concentrations (compared to the Si concentration of the Ge-rich channel region) to help prevent undesired dopant diffusion. Thus, in some embodiments one, two, or all three of the element-based (carbon-based, tin-based, and/or relatively higher Si-based) schemes may be employed to help prevent the undesired diffusion of dopant (e.g., B, P, or As) from a given S/D region into its corresponding Ge-rich channel region, as can be understood based on this disclosure. Further note that in embodiments employing tin as a dopant diffusion barrier element, it may be desired to include the tin in the bulk of a given S/D region such that it acts to lower the diffusivity of that bulk S/D region, thereby making it less likely that dopant outwardly diffuses from the bulk S/D region into the adjacent channel region.

In some embodiments, where tin is employed as a dopant diffusion barrier element in an interfacial layer between a given S/D region and its corresponding channel region, the tin-based dopant diffusion barrier interfacial layer may include a thickness in the range of 0.5-30 nm (or in a subrange of 0.5-2, 0.5-5, 0.5-10, 0.5-20, 1-2, 1-5, 1-10, 1-20, 1-30, 2-5, 2-10, 2-20, 2-30, 5-10, 5-20, 5-30, 10-20, 10-30, or 20-30 nm) or greater, for example. For instance, in some such embodiments, the thickness may be selected to be at least 5, 10, 15, or 20 nm so as to provide desired dopant diffusion barrier properties, particularly where the dopant diffusion barrier layer only utilizes tin as the dopant diffusion barrier element (e.g., a GeSn dopant diffusion barrier interfacial layer for a Ge channel). Further, in embodiments where tin is employed as a dopant diffusion barrier element in an interfacial layer between a given S/D region and its corresponding Ge-rich channel region, the tin-based dopant diffusion barrier layer includes non-tin group IV semiconductor material alloyed with the tin, such as SiSn, SiGeSn, GeSn, SiSn:C, SiGeSn:C, or GeSn:C, for example. Thus, in some embodiments, the tin concentration (by atomic percentage) included in a tin-based interfacial dopant diffusion barrier layer may be in the range of, for example, 1-6% (or in a subrange of 1-2, 1-3, 1-4, 1-5, 2-3, 2-4, 2-5, 2-6, 3-4, 3-5, 3-6, 4-5, 4-6, or 5-6%), or any other suitable value or range as will be apparent in light of this disclosure.

In embodiments where tin is alloyed into at least a majority of a given S/D region, such as alloying tin throughout at least a majority of the bulk of the S/D region (regardless of whether a dopant diffusion barrier layer is employed), tin may be present in at least 50, 60, 70, 80, 90, or 95% of the given S/D region. In some embodiments, where tin is alloyed into at least a majority of a given S/D region, tin may be throughout essentially the entirety of the S/D region. In embodiments where tin is alloyed into at least a majority of a given S/D region, it may be alloyed in a concentration (by atomic percentage) of, for example, 1-6% (or in a subrange of 1-2, 1-3, 1-4, 1-5, 2-3, 2-4, 2-5, 2-6, 3-4, 3-5, 3-6, 4-5, 4-6, or 5-6%), or any other suitable value or range as will be apparent in light of this disclosure. Such a relatively low concentration may be selected so as to achieve dopant diffusion barrier benefits and thereby help prevent short channel effects, without undesirably sacrificing other transistor performance areas (such as adversely affecting S/D resistance, the melting temperature of the S/D material, and/or the lattice constant of the material of the S/D region that could thereby cause undesired lattice mismatch).

Note that the thickness and/or concentration of the tin-based dopant diffusion barrier layer may be selected based on whether or not other dopant diffusion barrier elements are included in that barrier layer and/or whether or not tin or other dopant diffusion barrier elements are included in the bulk S/D region, in accordance with some embodiments. For example, in embodiments where a tin-based dopant diffusion barrier layer also includes carbon, that tin and carbon-based layer may be formed in a relatively thinner manner compared to where the tin-based layer does not include carbon, while still achieving the same dopant diffusion barrier effects. Also note that the concentration of the tin alloy in a given S/D region, when included as a dopant diffusion barrier element, may be relatively less when a carbon-based dopant diffusion barrier layer is present at the interface between that tin-alloyed S/D region and the Ge-rich channel region. This is generally the case for any dopant diffusion scheme employed herein, where utilizing two or all three of the carbon, tin, and relatively higher Si content (as compared to the Ge-rich channel region) dopant diffusion elements in a given S/D region may improve the dopant diffusion barrier effect as compared to just employing one of them, and thus, smaller thicknesses and/or concentrations may be selected while still achieving the same dopant diffusion barrier effects, as can be understood based on this disclosure.

In some embodiments, the techniques can be used to benefit a multitude of transistor devices. For instance, in some embodiments, the techniques may be used to benefit metal-oxide-semiconductor field-effect transistors (MOSFETs), tunnel FETs (TFETs), fermi-filter FETs (FFFETs), and/or any other suitable FET or transistor device, as can be understood based on this disclosure. Further, in some embodiments, the techniques may be used to benefit one or more n-channel transistor devices (where the charge carriers are electrons) and/or p-channel transistor devices (where the charge carriers are holes), such as n-channel MOSFET (n-MOS) devices and/or p-channel MOSFET (p-MOS) devices. In some embodiments, the techniques described herein can be used to benefit complementary transistor circuits, such as CMOS circuits, where the techniques can be used to benefit one or more of the included n-channel transistors (e.g., n-MOS devices) and/or p-channel transistors (e.g., p-MOS devices) making up a given CMOS circuit. Further still, in some embodiments, the techniques described herein can be used to benefit transistors including a multitude of configurations, such as planar and non-planar configurations, where the non-planar configurations may include finned or FinFET configurations (e.g., dual-gate or tri-gate), gate-all-around (GAA) configurations (e.g., nanowire or nanoribbon), or some combination thereof (e.g., beaded-fin configurations), to provide a few examples. Other example transistor devices that can benefit from the techniques described herein include few to single electron quantum transistor devices, for example.

Note that, as used herein, the expression "X includes at least one of A and B" refers to an X that may include, for example, just A only, just B only, or both A and B. To this end, an X that includes at least one of A and B is not to be understood as an X that requires each of A and B, unless expressly so stated. For instance, the expression "X includes A and B" refers to an X that expressly includes both A and B. Moreover, this is true for any number of items greater than two, where "at least one of" those items is included in X. For example, as used herein, the expression "X includes at least one of A, B, and C" refers to an X that may include just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, and C is not to be understood as an X that requires each of A, B, and C, unless expressly so stated. For instance, the expression "X includes A, B, and C" refers to an X that expressly includes each of A, B, and C. Likewise, the expression "X included in at least one of A and B refers to an X that may be included, for example, in just A only, in just B only, or in both A and B. The above discussion with respect to "X includes at least one of A and B" equally applies here, as will be appreciated.

Use of the techniques and structures provided herein may be detectable using tools such as: electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate an integrated circuit (IC) including at least one Ge-rich channel transistor that includes one or more dopant diffusion barrier elements as described herein. In some such embodiments, the included elements, which may include alloying of carbon, tin, and/or silicon (e.g., where the silicon may be in a concentration greater than that of Ge-rich channel) in at least a portion of one or both S/D regions. For instance, in some embodiments, one or more of the dopant diffusion barrier elements are included in a layer at the interface of the Ge-rich channel region and a corresponding adjacent source region, while in other embodiments, one or more of the dopant diffusion barrier elements are included throughout at least a majority of a given S/D region, while in still other embodiments, one or more of the dopant diffusion barrier elements are included in both the interfacial layer and throughout at least a majority of the given S/D region. For instance, in some such embodiments, the techniques may be detected by observing (e.g., via SEM/TEM) that carbon and/or tin is present in a given S/D region (e.g., in the interfacial layer and/or throughout at least a majority of the region) when it otherwise should not be present.

In some embodiments, the techniques and structures described herein may be detected based on the benefits derived therefrom, such as by observing a Ge-rich channel region that includes relatively reduce dopant from one or both of the adjacent S/D regions as a result of the employment of one or more dopant diffusion barrier elements as described herein (e.g., as compared to Ge-rich channel regions that do not employ the techniques described herein). In some embodiments, the techniques may be observed by determining that the effective channel length of a given Ge-rich channel transistor has the same length as, or approximately the same length as (e.g., within a maximum of 1-10 nm relative difference or within a maximum of 1-10% relative difference) the length of the gate electrode (referred to as the gate length). Thus, in some embodiments, the techniques described herein may enable forming enhanced performance transistor devices with sub-50 nm gate lengths (or gate lengths below some other suitable threshold, as will be apparent in light of this disclosure), which can also be detected and measured. Numerous configurations and variations will be apparent in light of this disclosure.

Architecture and Methodology

FIG. 1 illustrates method 100 of forming an integrated circuit (IC) including at least one Ge-rich channel transistor employing one or more dopant diffusion barrier elements, specifically, to help prevent S/D dopant from diffusing into a corresponding channel region, in accordance with some embodiments of the present disclosure. FIGS. 2A-K illustrate example IC structures that are formed when carrying out method 100 of FIG. 1, in accordance with some embodiments. The structures of FIGS. 2A-K are primarily depicted and described herein in the context of forming finned or FinFET transistor configurations (e.g., tri-gate transistor configurations), for ease of illustration. However, in some embodiments, the techniques can be used to form transistors of any suitable geometry or configuration, as can be understood based on this disclosure. For example, FIG. 2I illustrates an example IC structure including a transistor having a nanowire configuration and a transistor having a beaded-fin configuration, as will be described in more detail below. Also note that the techniques and structures are primarily depicted and described in the context of forming metal-oxide-semiconductor field-effect transistors (MOSFETs). However, the present disclosure is not intended to be so limited unless stated otherwise. Further note that method 100 includes a primary path that illustrates a gate last transistor fabrication process flow that can be employed in accordance with some embodiments. However, in other embodiments, a gate first process flow may be employed instead, as will be described herein (and which is illustrated with the alternative gate first flow 100' indicator in FIG. 1). Numerous variations and configurations will be apparent in light of this disclosure.

A multitude of different transistors and transistor-based devices can benefit from the techniques described herein, which may include, but are not limited to, various different field-effect transistors (FETs), such as metal-oxide-semiconductor FETs (MOSFETs), tunnel FETs (TFETs), and Fermi filter FETs (FFFETs), to name a few examples. For example, the techniques may be used to introduce one or more dopant diffusion barriers in one or both of the S/D regions of an n-channel MOSFET (n-MOS) device, which may include a source-channel-drain doping scheme of n-p-n or n-i-n, where 'n' indicates n-type doped semiconductor material, 'p' indicates p-type doped semiconductor material, and T indicates intrinsic/undoped semiconductor material (which may also include nominally undoped semiconductor material, including dopant concentrations of less than 1E16 atoms per cubic centimeter (cm), for example), in accordance with some embodiments. In another example, the techniques may be used to introduce one or more dopant diffusion barriers in one or both of the S/D regions of a p-channel MOSFET (p-MOS) device, which may include a source-channel-drain doping scheme of p-n-p or p-i-p, in accordance with some embodiments. In yet another example, the techniques may be used to benefit a TFET device, which may include a source-channel-drain doping scheme of p-i-n or n-i-p, in accordance with some embodiments. In still another example, the techniques may be used to benefit a FFFET device, which may include a source-channel-drain doping scheme of np-i-p (or np-n-p) or pn-i-n (or pn-p-n), in accordance with some embodiments. Further, the techniques may be used to benefit complementary transistor circuits, such as CMOS circuits, where the techniques may be used to benefit one or more of the included n-channel and/or p-channel transistors making up the complementary circuit. Other example transistor devices that can benefit from the techniques described herein include few to single electron quantum transistor devices, in accordance with some embodiments. Further still, any such devices may employ semiconductor materials that are three-dimensional crystals as well as two dimensional crystals or nanotubes, for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

Figure 2A:
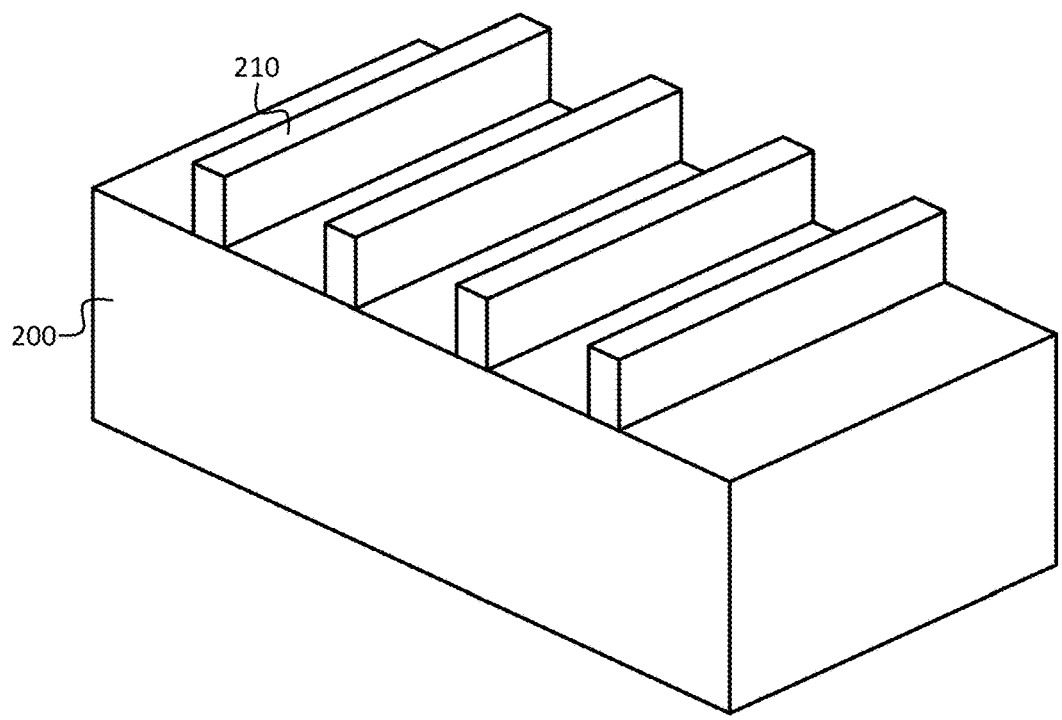
FIGS. 2A-K illustrate example IC structures that are formed when carrying out the method of FIG. 1, in accordance with some embodiments. Note that FIG. 2H illustrates the method of FIG. 1 after just process 112 has been performed (and process 112 has not been performed), FIG. 2G' illustrates the method of FIG. 1 after just process 114 has been performed (and process 112 has not been performed), and FIG. 2H' illustrates the method of FIG. 1 after both processes 112 and 114 have been performed, as can be understood based on this disclosure.

Method 100 of FIG. 1 includes patterning 102 hardmask on a substrate, such as patterning hardmask 210 on substrate 200 to form the example structure of FIG. 2A, in accordance with some embodiments. In some embodiments, hardmask 210 may be deposited or otherwise formed on substrate 200 using any suitable techniques as will be apparent in light of this disclosure. For example, hardmask 210 may be blanket deposited or otherwise grown on substrate 200 using chemical vapor deposition (CVD), atomic layer deposition (ALD), physical vapor deposition (PVD), spin-on processing, and/or any other suitable process to form hardmask 210 on substrate 200. In some instances, the top surface of substrate 200 on which hardmask 210 is to be deposited may be treated (e.g., via chemical treatment, thermal treatment, etc.) prior to deposition of the hardmask 210 material. After being blanket formed on substrate 200, hardmask 210 may then be patterned using any suitable techniques, such as one or more lithography and etch processes, for example. Hardmask 210 may include any suitable material, such as oxide material, nitride material, and/or any other suitable dielectric/electrical insulator material, for example. Specific oxide and nitride materials may include silicon oxide, titanium oxide, hafnium oxide, aluminum oxide, silicon nitride, and titanium nitride, just to name a few examples. In some cases, the material of hardmask 210 may be selected based on the material of substrate 200, for example.

Substrate 200, in some embodiments, may be: a bulk substrate including group IV semiconductor material (e.g., Si, Ge, SiGe), group III-V semiconductor material, and/or any other suitable material(s) as will be apparent in light of this disclosure; an X on insulator (XOI) structure where X is one of the aforementioned materials (e.g., group IV and/or group III-V semiconductor material) and the insulator material is an oxide material or dielectric material or some other electrically insulating material, such that the XOI structure includes the electrically insulating material layer between two semiconductor layers; or some other suitable multilayer structure where the top layer includes one of the aforementioned semiconductor materials (e.g., group IV and/or group III-V semiconductor material). The use of "group IV semiconductor material" (or "group IV material" or generally, "IV") herein includes at least one group IV element (e.g., silicon, germanium, carbon, tin), such as silicon (Si), germanium (Ge), silicon germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), and so forth. Note that group III may also be known as the boron group or IUPAC group 13, group IV may also be known as the carbon group or IUPAC group 14, and group V may also be known as the nitrogen family or IUPAC group 15, for example. In some embodiments, substrate 200 may include Ge-rich material to be used in the channel region of one or more transistors.

In some embodiments, substrate 200 may be doped with any suitable n-type and/or p-type dopant. For instance, in the case, of a Si substrate, the Si may be p-type doped using a suitable acceptor (e.g., boron) or n-type doped using a suitable donor (e.g., phosphorous, arsenic), to provide some example cases. However, in some embodiments, substrate 200 may be undoped/intrinsic or relatively minimally doped (such as including a dopant concentration of less than 1E16 atoms per cubic cm), for example. In some embodiments, substrate 200 may include a surface crystalline orientation described by a Miller index of (100), (110), or (111), or its equivalents, as will be apparent in light of this disclosure. Although substrate 200, in this example embodiment, is shown as having a thickness (dimension in the Y-axis direction) similar to other layers shown in subsequent structures for ease of illustration, in some instances, substrate 200 may be much thicker than the other layers, such as having a thickness in the range of 50 to 950 microns, for example, or any other suitable thickness as will be apparent in light of this disclosure. In some embodiments, substrate 200 may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various radio frequency (RF) devices, various sensors, or any other suitable semiconductor or IC devices, depending on the end use or target application. Accordingly, in some embodiments, the structures described herein may be included in a system-on-chip (SoC) application, as will be apparent in light of this disclosure.

Figure 2B:
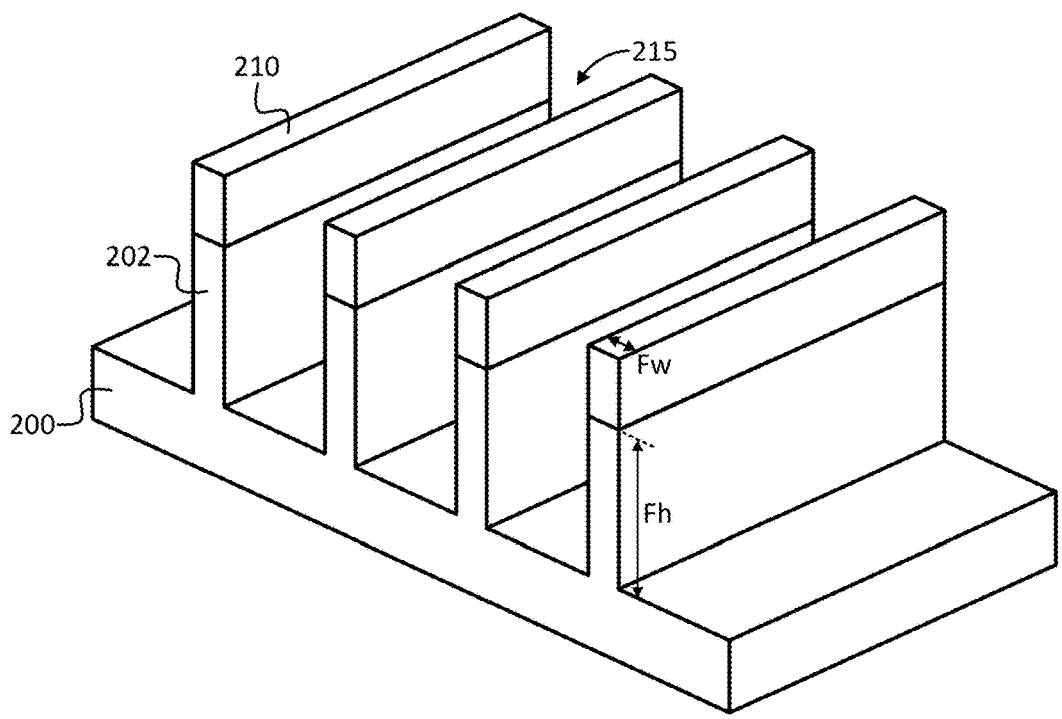

Method 100 of FIG. 1 continues with performing 104 shallow trench recess (STR) etch to form fins 202 from substrate 200, thereby forming the resulting example structure shown in FIG. 2B, in accordance with some embodiments. In some embodiments, the STR etch 104 used to form trenches 215 and fins 202 may include any suitable techniques, such as various masking processes and wet and/or dry etching processes, for example. In some cases, STR etch 104 may be performed in-situ/without air break, while in other cases, STR etch 104 may be performed ex-situ, for example. Trenches 215 may be formed with varying widths (dimension in the X-axis direction) and depths (dimension in the Y-axis direction) as can be understood based on this disclosure. For example, multiple hardmask patterning 102 and STR etching 104 processes may be performed to achieve varying depths in the trenches 215 between fins 202. Fins 202 may be formed to have varying widths Fw (dimension in the X-axis direction) and heights Fh (dimension in the Y-axis direction). Note that although hardmask structures 210 are still present in the example structure of FIG. 2B, in some cases, that need not be the case, as they may have been consumed during the STR etch, for example.

In some embodiments, the fin widths Fw (dimension in the horizontal or X-axis direction) may be in the range of 2-400 nm (or in a subrange of 2-10, 2-20, 2-50, 2-100, 2-200, 4-10, 4-20, 4-50, 4-100, 4-200, 4-400, 10-20, 10-50, 10-100, 10-200, 10-400, 50-100, 50-200, 50-400, or 100-400 nm), for example, or any other suitable value or range as will be apparent in light of this disclosure. In some embodiments, the fin heights Fh (dimension in the vertical or Y-axis direction) may be in the range of 4-800 nm (or in a subrange of 4-10, 4-20, 4-50, 4-100, 4-200, 4-400, 10-20, 10-50, 10-100, 10-200, 10-400, 10-800, 50-100, 50-200, 50-400, 50-800, 100-400, 100-800, or 400-800 nm), for example, or any other suitable value or range as will be apparent in light of this disclosure. In some embodiments, the fin heights Fh may be at least 25, 50, 75, 100, 125, 150, 175, 200, 300, 400, or 500, 600, 700, or 800 nm tall, or greater than any other suitable threshold height as will be apparent in light of this disclosure. In some embodiments, the height to width ratio of the fins (Fh:Fw) may be greater than 1, such as greater than 1.5, 2, 2.5, 3, 3.5, 4, 4.5, 5, 6, 7, 8, 9, or 10, or greater than any other suitable threshold ratio, as will be apparent in light of this disclosure. Note that the trenches 215 and fins 202 are each shown as having essentially the same sizes and shapes in this example structure for ease of illustration; however, the present disclosure is not intended to be so limited. For example, in some embodiments, the fins 202 may be formed to have varying heights Fh, varying widths Fw, varying starting points (or varying starting heights), varying shapes, and/or any other suitable variations as will be apparent in light of this disclosure. Moreover, trenches 215 may be formed to have varying depths, varying widths, varying starting points (or varying starting depths), varying shapes, and/or any other suitable variations as will be apparent in light of this disclosure. Further note that although four fins 202 are shown in the example structure of FIG. 2B for ease of illustration, any number of fins may be formed, such as one, two, three, five, ten, hundreds, thousands, millions, billions, and so forth, as can be understood based on this disclosure.

Figure 2C:
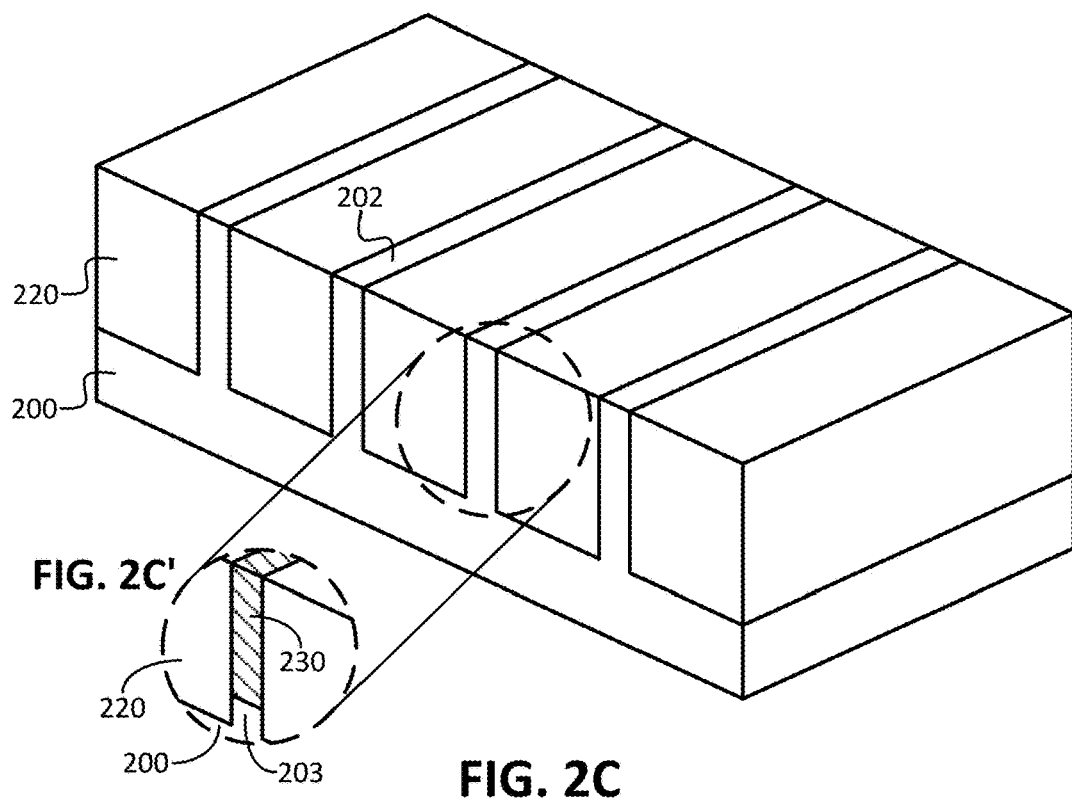

Method 100 of FIG. 1 continues with depositing 106 shallow trench isolation (STI) material 220 and planarizing/polishing the structure to form the example resulting structure of FIG. 2C, in accordance with some embodiments. In some embodiments, deposition 106 of STI material 220 may include any suitable deposition techniques, such as those described herein (e.g., CVD, ALD, PVD), or any other suitable deposition process. In some embodiments, STI material 220 (which may be referred to as an STI layer) may include any suitable electrically insulating material, such as one or more dielectric, oxide (e.g., silicon dioxide), and/or nitride (e.g., silicon nitride) materials. In some embodiments, the material of STI layer 220 may selected based on the material of substrate 200. For instance, in the case of a Si substrate, the STI material may be selected to be silicon dioxide or silicon nitride, to provide some examples. In some embodiments, the planarizing and/or polishing process (es) performed after forming STI material 220 may include any suitable techniques, such as chemical-mechanical planarization/polishing (CMP) processes, for example.

In embodiments where the fins are to be removed and replaced with replacement semiconductor material (e.g., to be used in the channel region of one or more transistor devices), the structure of FIG. 2C enables such processing. For example, continuing from the structure of FIG. 2C, fins 202 may be recessed or removed using selective etch processing (e.g., for a given etchant, the semiconductor material of fins 202 is removed selective to the insulator material of STI layer 220) to form fin-shaped trenches between STI material 220 in which replacement semiconductor material can be deposited/grown (e.g., using any suitable techniques, such as CVD, metal-organic CVD (MOCVD), ALD, molecular beam epitaxy (MBE), PVD). For instance, FIG. 2C' is a blown-out portion of FIG. 2C illustrating alternative recess and replace processing to form a replacement material fin, in accordance with some embodiments. In FIG. 2C', replacement fin 230 was formed, and the replacement fin 230 (and generally, any replacement fin formed) may include any suitable semiconductor material (e.g., group IV and/or III-V semiconductor material). For instance, replacement fins including SiGe or Ge may be formed by removing native Si fins during such processing and replacing them with the SiGe or Ge material, to provide some examples. In addition, replacement fin 230 may include any suitable n-type or p-type dopant. In some embodiments, replacement material fins, such as replacement fin 230 of FIG. 2C' may be formed using alternative processing. For instance, in some embodiments, replacement material fins may be formed by blanket-growing the replacement material on the substrate (e.g., using epitaxial deposition processing) and then patterning the replacement material into replacement material fins, to provide an example alternative. Such an example alternative process may also include forming STI material between the replacement material fins to form a structure similar to that shown in FIG. 2D', for instance. Note that replacement fin 230 is illustrated with patterning/shading to merely assist with visually identifying that feature.

Note that only one fin is shown being replaced in the example embodiment of FIG. 2C'; however, the present disclosure is not intended to be so limited. In some embodiments, all of the native fins 202 may be replaced or only a subset may be replaced (e.g., such that some replacement fins are available for subsequent processing and some native fins 202 remain for subsequent processing). Further, in some embodiments, the recess and replace process may be performed as many times as desired to form as many subsets of replacement fins as desired by masking off the areas not to be processes for each replacement fin subset processing. In some such embodiments, a first subset of replacement fins may be formed for n-channel transistors (e.g., where the first replacement material is selected to increase electron mobility) and a second subset of replacement fins may be formed for p-channel transistors (e.g., where the second replacement material is selected to increase hole mobility). Further still, in some embodiments, a multilayer replacement fin may be formed to enable the subsequent formation of nanowires or nanoribbons in the channel region of one or more transistors, where some of the layers in the multilayer replacement fin are sacrificial and intended to be removed via selective etching (e.g., during replacement gate processing), which will be described in more detail herein. Moreover, in instances where the sacrificial material is not completely removed, a beaded-fin configuration may be achieved, as will also be described in more detail herein. Note that the recess process used to form replacement fin 230 included recessing native fin 202 (i.e., native to substrate 200) to a depth as shown, such that a portion of that native fin 202 remains, which is referred to as sub-fin portion 203 (indicated in FIG. 2C'). However, in other embodiments, the recess process may completely remove a given native fin 202 or recess the given native fin 202 to a different depth (e.g., a different point in the vertical or Y-axis direction).

Generally, in a trench fill integration scheme, the fins may be formed to have particular height to width ratios (e.g., at least 2-5) such that when they are later removed or recessed, the resulting trenches formed allow the replacement material deposited to grow vertically from the native substrate bottom and be confined by non-crystalline/dielectric sidewalls. The material used to fill these trenches may be sufficiently lattice matched to the substrate (or to a buffer layer used between the substrate and replacement material) such that effectively no relaxation or threading misfit dislocation formation occurs (e.g., the misfit dislocations occur at levels below 1E5 dislocations per square cm). For instance, this lattice match condition is true for native Si fins and trench fill of SiGe replacement material having Ge concentration (by atomic percentage) of less than 45% and fin heights Fh of less than 50 nm, to provide an example. Alternatively, using the Si substrate example (where the native Si fins are recessed to form trenches), a replacement material trench fill of Ge, SiGe with Ge concentration of at least 80%, or GaAs can be performed such that the dislocations form right at the native/replacement material interface and again effectively no threading misfit dislocation formation occurs at the top surface of the replacement material fin (e.g., the misfit dislocations occur at levels below 1E5 dislocations per square cm). In some embodiments, replacement fins (such as replacement fin 230) may be formed to include Ge-rich material, such that a portion of one or more of those replacement fins can be used in the channel region of one or more transistors, as can be understood based on this disclosure.

Figure 2D:
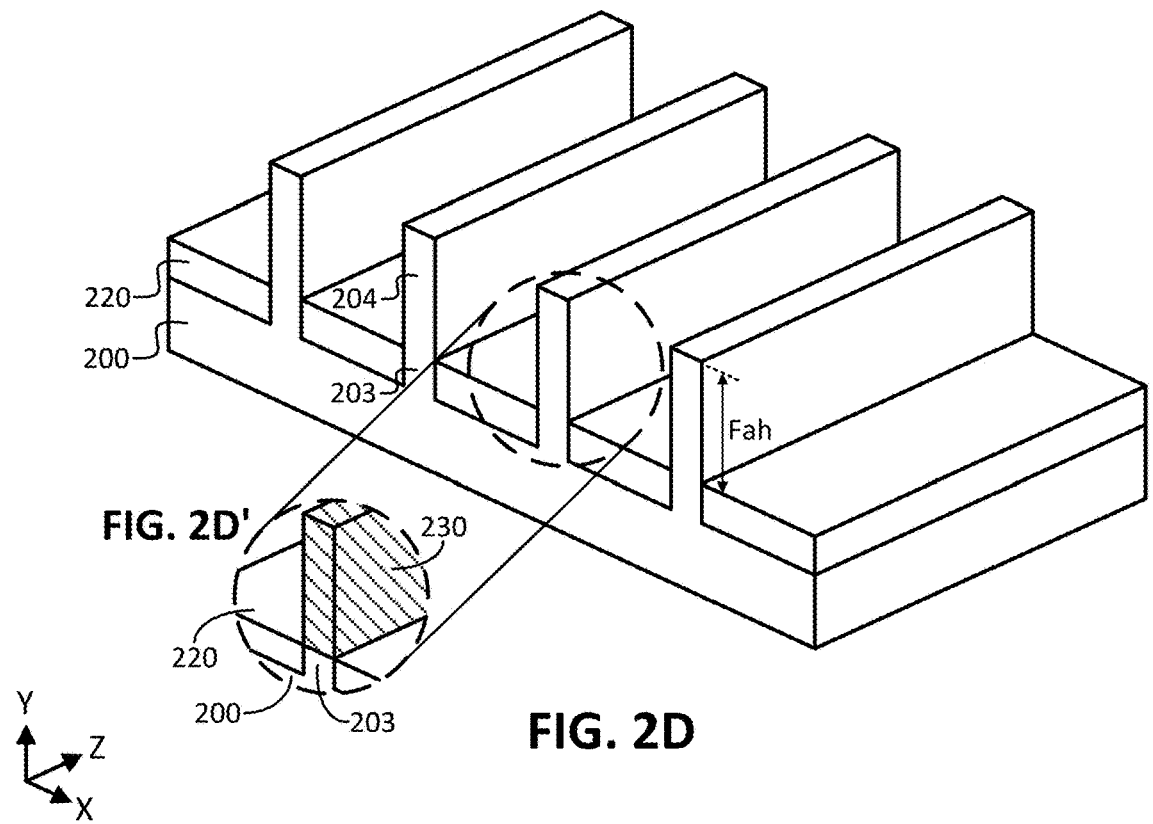

Method 100 of FIG. 1 continues with recessing 108 the STI material 220 to cause at least a portion 204 of fins 202 to exude from the STI plane, thereby forming the resulting example structure shown in FIG. 2D, in accordance with some embodiments. In some embodiments, recessing 112 may be performed using any suitable techniques, such as using one or more wet and/or dry etch processes that allow the STI material 220 to be selectively recessed relative to the material of fin 202, and/or any other suitable processing as will be apparent in light of this disclosure. As can be understood based on this disclosure, fin portions 204 may be used in the active channel region of one or more transistors, such that fin portions 204 (the portions of fins 202 above the top plane of STI layer 220 after recess 108 has been performed) may be referred to as active fin portions herein, for example. Moreover, the remaining portions of fins 202 below the top plane of STI layer 220 are indicated as portions 203, where such portions may be referred to as sub-fin or sub-channel portions, for example.

As shown in FIG. 2D, the portions 204 of fins 202 exuding above the top plane of STI layer 220 have an active fin height indicated as Fah, which may be in the range of 4-800 nm (e.g., in the subrange of 4-10, 4-20, 4-50, 4-100, 4-200, 4-400, 10-20, 10-50, 10-100, 10-200, 10-400, 10-800, 50-100, 50-200, 50-400, 50-800, 100-400, 100-800, or 400-800 nm), for example, or any other suitable value or range, as will be apparent in light of this disclosure. In some embodiments, the active fin heights Fah may be at least 25, 50, 75, 100, 125, 150, 175, 200, 300, 400, 500, 600, 700, or 800 nm tall, or greater than any other suitable threshold height as will be apparent in light of this disclosure. The active fin height is referred to as such because at least one portion of that fin (along the Z-axis) may be used in the channel region of a least one transistor, where the sub-fin 203 (which is between two regions of STI material 220) would not be (or is desired to not be) a part of the channel region that includes the location for the active channel. FIG. 2D' is a blown-out portion of FIG. 2D illustrating the replacement fin 230 from FIG. 2C' after the STI material has been recessed, in accordance with some embodiments. Although replacement fin 230 was formed using the techniques described herein that employ a fin-shaped trench, in other embodiments, replacement fin 230 may be formed using alternative techniques, such as by blanket depositing the replacement material and forming the replacement material into fins, followed by STI processing, as previously described. Also note that in embodiments employing planar transistor configurations, recess process 108 need not be performed, as the transistor may be formed using the top portion of fin 202 from FIG. 2C (or the top portion of fin 230 from FIG. 2C'), for example.

Figure 2E:
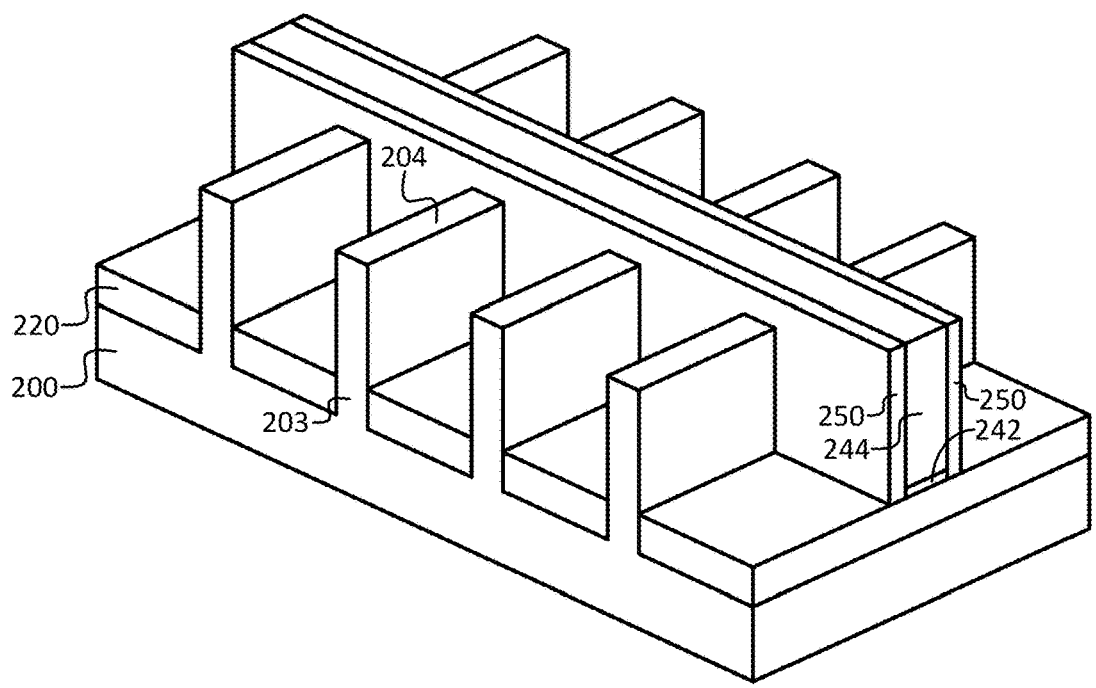
Figure 2F:
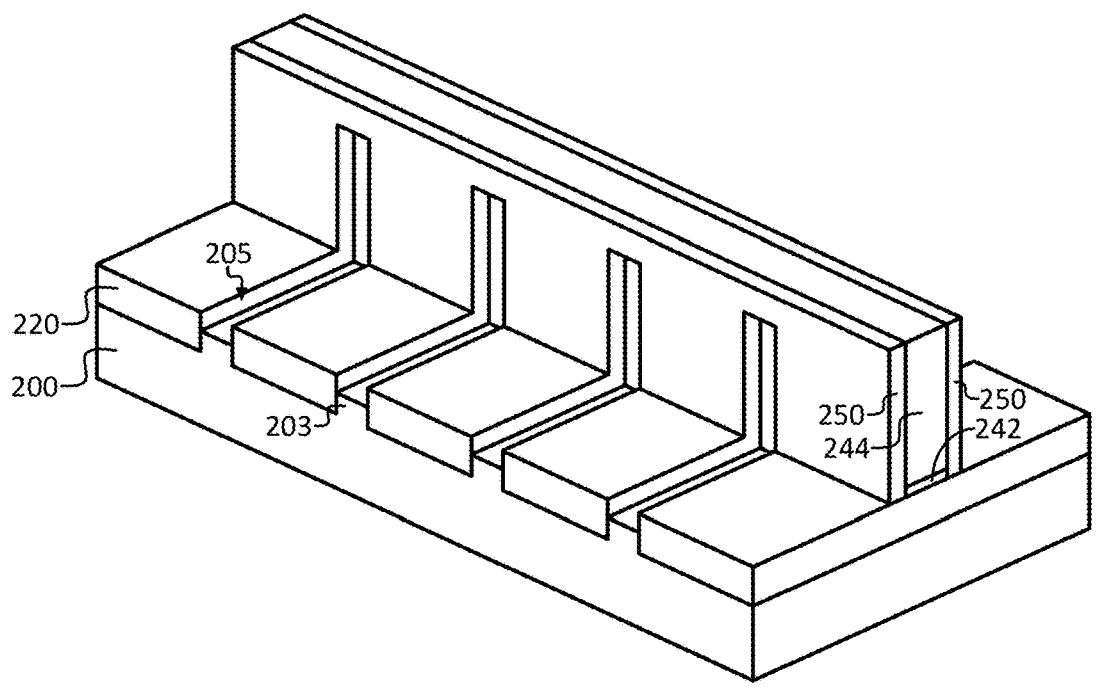

Method 100 of FIG. 1 continues with optionally forming 110 a dummy gate stack to form the example resulting structure of FIG. 2E, in accordance with some embodiments. Recall that method 100 is primarily described herein in the context of a gate last transistor fabrication process flow, where the processing includes forming a dummy gate stack, performing the S/D processing, and then forming the final gate stack after the S/D regions have been processed. However, in other embodiments, the techniques may be performed using a gate first process flow. In such an example case, process 110 (forming a dummy gate stack) would not be performed, and thus, process 110 may be optional in some embodiments (such as those employing the gate first process flow). This is reflected with the alternative location for performing 116 final gate stack processing, which is shown as the optional gate first flow 100' in FIG. 1, where performing 116 the final gate stack processing would instead occur at the location of box 110 in embodiments employing a gate first process flow, for example. However, the description of method 100 will continue using a gate last process flow, to allow for such a flow (which generally includes additional processing) to be adequately described.

Continuing with forming 110 a dummy gate stack, such a dummy gate stack (where employed) may include dummy gate dielectric 242 and dummy gate electrode 244, thereby forming the example resulting structure of FIG. 2E, in this example embodiment. In this example embodiment, dummy gate dielectric 242 (e.g., dummy oxide material) and dummy gate electrode 244 (e.g., dummy poly-silicon material) may be used for a replacement gate process. Note that side-wall spacers 250, referred to generally as gate spacers (or simply, spacers), on either side of the dummy gate stack were also formed, and such spacers 250 can be used to help determine the channel length and/or to help with replacement gate processes, for example. As can be understood based on this disclosure, the dummy gate stack (and spacers 250) can help define the channel region and source/drain (S/D) regions of each fin, where the channel region is below the dummy gate stack (as it will be located below the final gate stack), and the S/D regions are on either side of and adjacent to the channel region. Note that because the IC structures are being described in the context of forming finned transistors, the final gate stack will also be adjacent to either side of the fin, as the gate stack will reside along three walls of the finned channel regions, in embodiments employing a finned (e.g., FinFET) configuration.

Formation of the dummy gate stack may include depositing the dummy gate dielectric material 242 and dummy gate electrode material 244, patterning the dummy gate stack, depositing gate spacer material 250, and performing a spacer etch to form the structure shown in FIG. 2E, for example. Spacers 250 may include any suitable material, such as any suitable electrical insulator, dielectric, oxide (e.g., silicon oxide), and/or nitride (e.g., silicon nitride) material, as will be apparent in light of this disclosure. Note that in some embodiments, as previously described, the techniques described herein need not include forming a dummy gate stack, such that a final gate stack may be formed in the first instance. Regardless, the end structure will include the final gate stack described herein, as will be apparent in light of this disclosure. Also note that in some embodiments, a hardmask may be formed over the dummy gate stack (which may or may not also be formed over spacers 250) to protect the dummy gate stack during subsequent processing, for example. The previous relevant description of hardmask 210 is equally applicable to such a hardmask feature, where employed.

Method 100 of FIG. 1 continues with performing the source/drain (S/D) region processing, where the S/D region processing includes forming 112 a dopant diffusion barrier layer and/or alloying 114 the S/D region material with one or more dopant diffusion barrier elements, in accordance with some embodiments. Regardless, the processing includes, in this example embodiment, removing portions of fins 204 (or replacement fins 230, where employed) located in the S/D regions defined by the dummy gate stack, to form S/D trenches 205 as shown in the example resulting structure of FIG. 2F. In some embodiments, removing the portions of fins 204 (or the portions of replacement fins 230, where employed) in the S/D regions may include any suitable techniques, such as one or more wet and/or dry etch processes, for example. In the example embodiment shown in FIG. 2F, the removal portions of the sub-fin 203 and portions of the fin 204 that were located under spacers 250 were removed; however, the present disclosure is not intended to be so limited, as the removal process may result in the formation of a different template structure from which the final S/D regions can be re-grown.

Figure 2G:
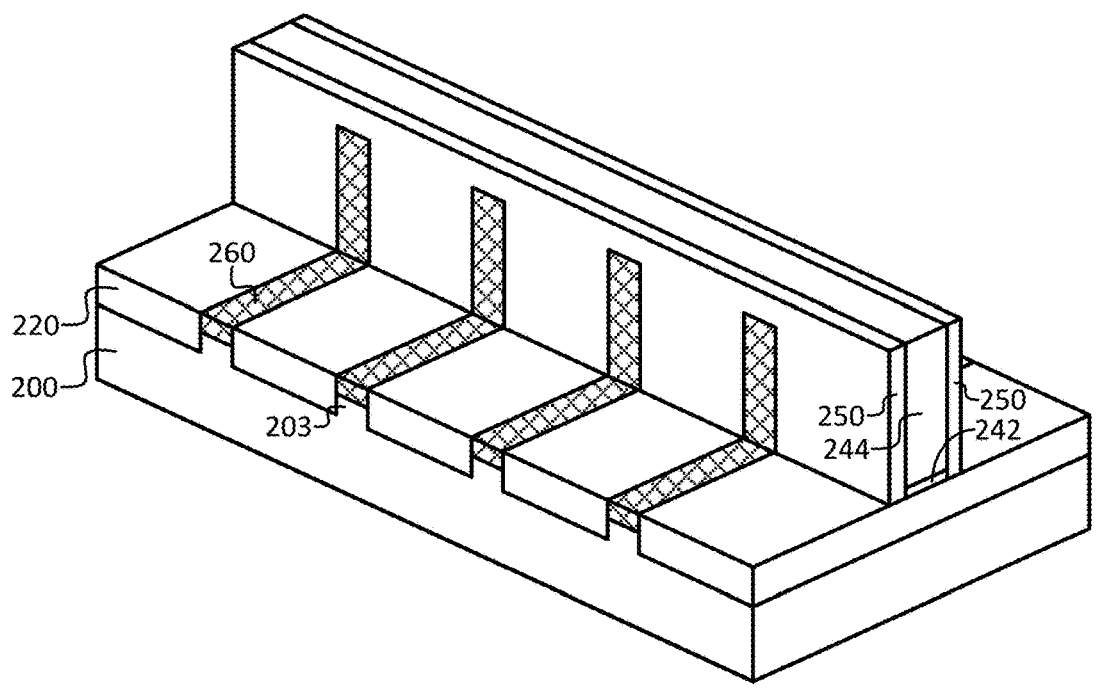
Figure 2H:
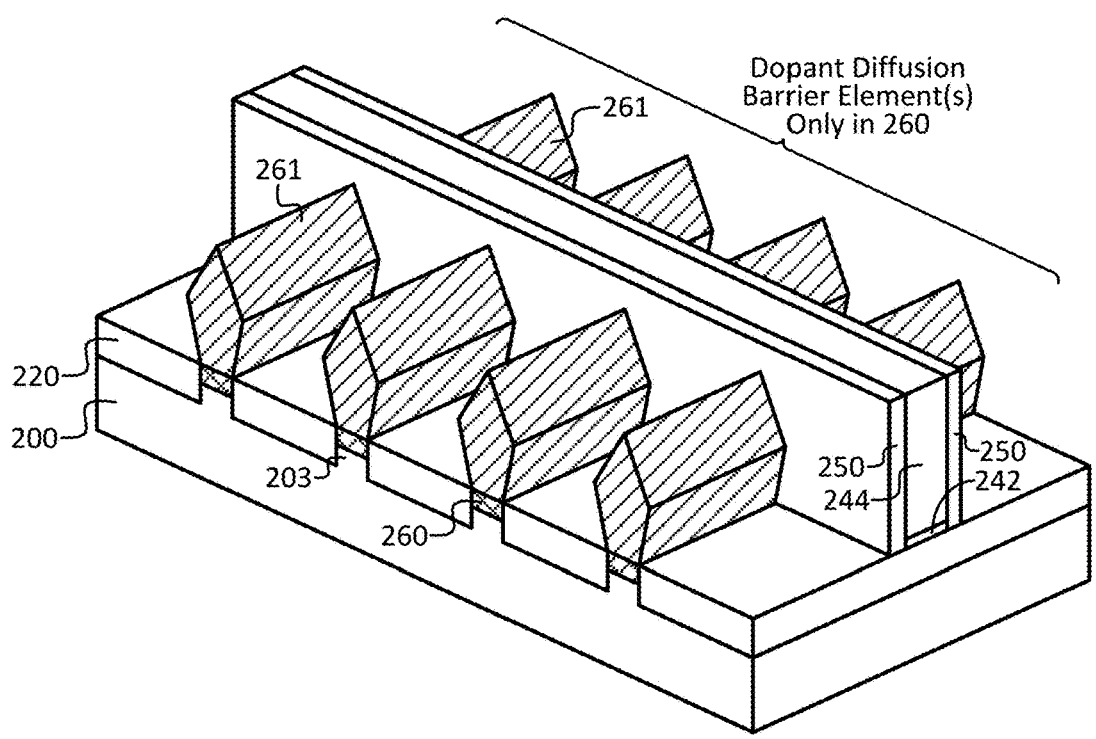
Figure 2G:
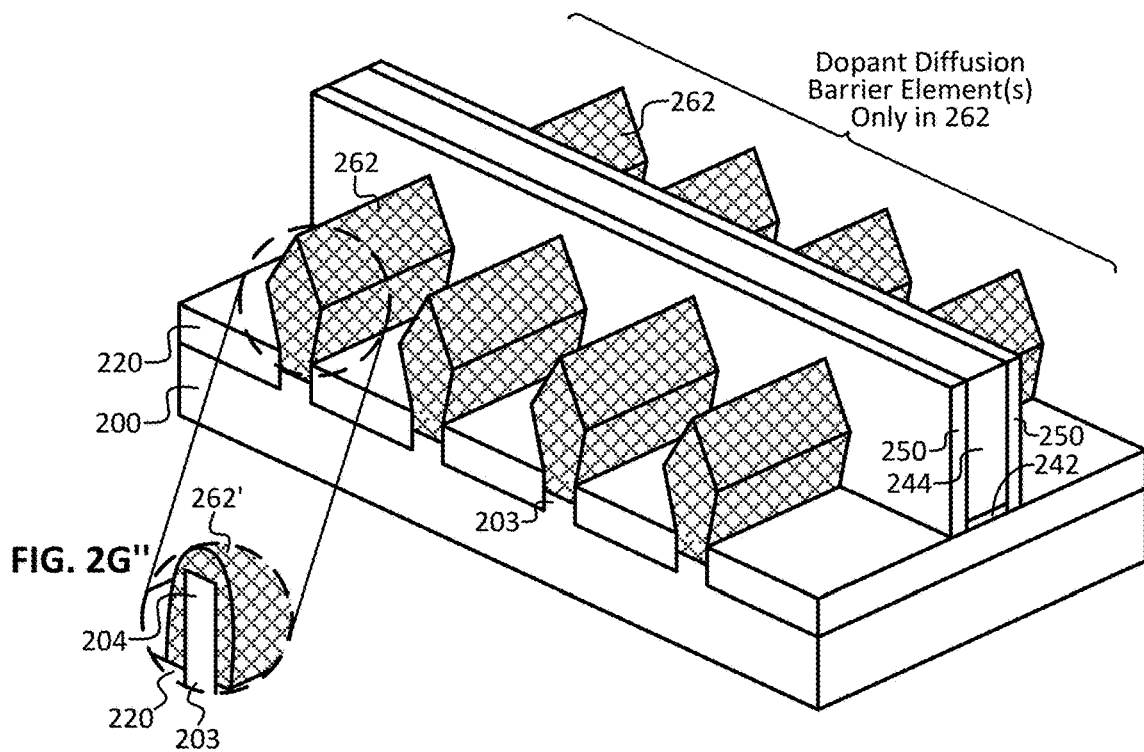
Figure 2H:
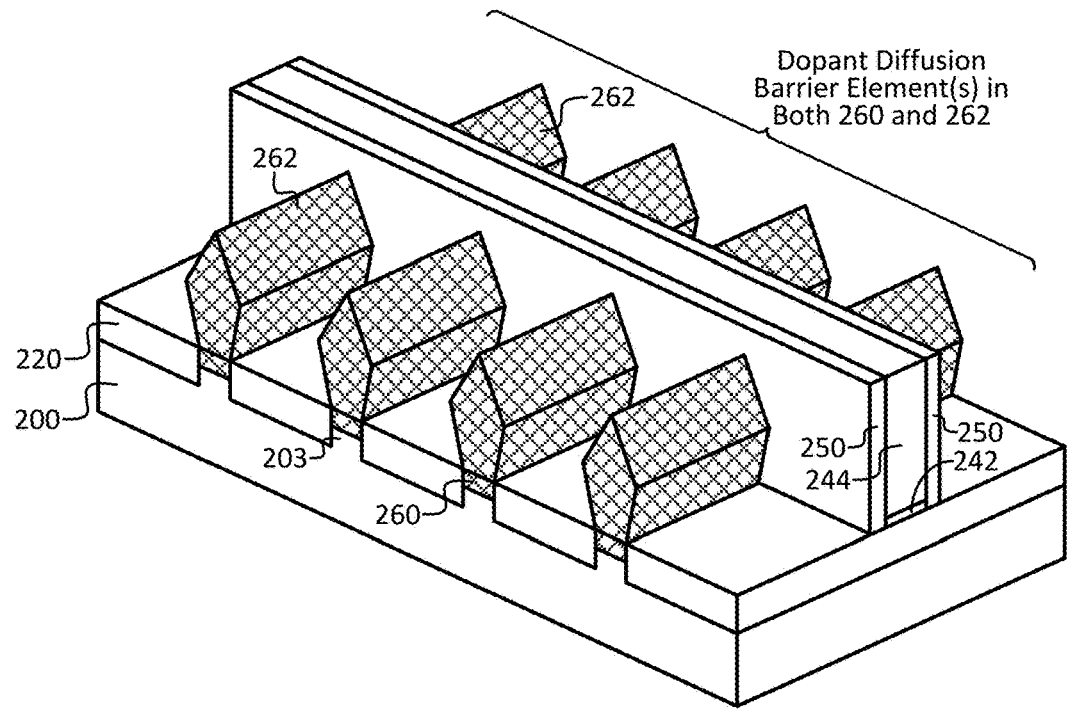
Figure 2I:
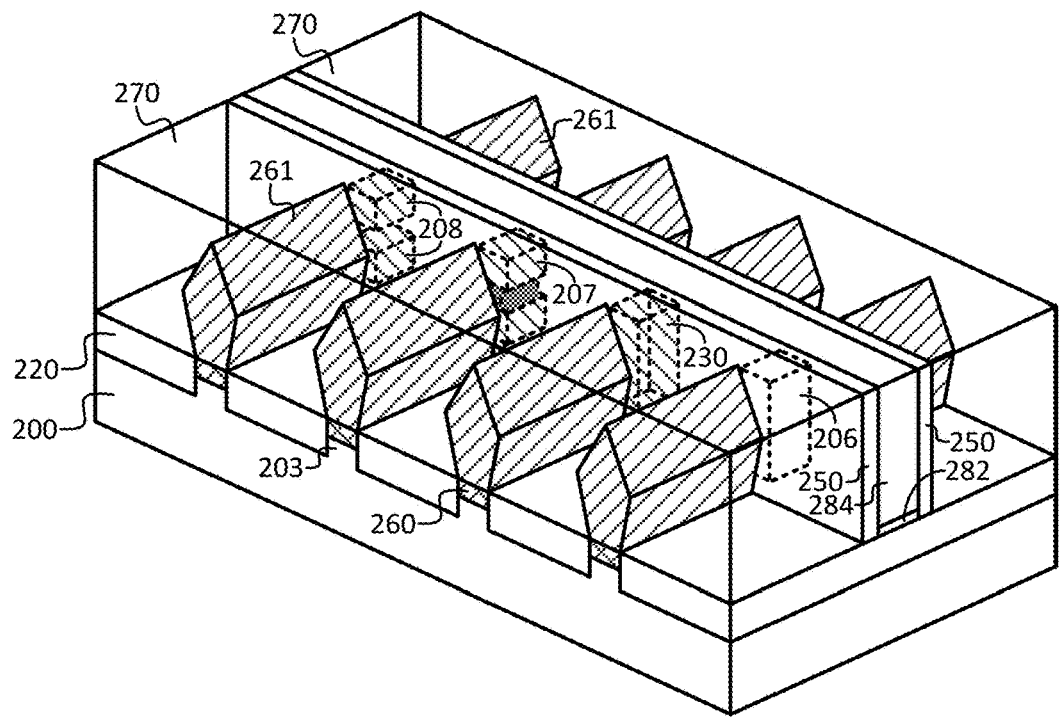

Continuing with just performing process 112, such that process 114 is not performed, and thus, dopant diffusion barrier element(s) are formed only in the dopant diffusion barrier layer 260, the resulting example structure of FIG. 2H can be formed, in accordance with some embodiments. In more detail, process 112 included forming dopant diffusion barrier layer 260 to form the example resulting structure of FIG. 2G, followed by forming the bulk S/D regions 261 from the dopant diffusion barrier layer 260 (e.g., using the dopant diffusion barrier layer 260 as a seeding layer) to form the example structure of FIG. 2H, in this example embodiment. Recall that the dopant diffusion barrier elements include relatively higher Si concentration (compared to the Ge-rich channel region), carbon, and/or tin, such that employing one or more of them can help prevent the diffusion of dopant included in the S/D regions (such as dopant included in 260 and/or 261) from diffusing into the corresponding channel region, as will be described in more detail below. However, in some embodiments, it may be desired to include carbon in dopant diffusion barrier layer 260 such that the carbon-based dopant diffusion barrier layer can essentially block the diffusion of dopants from bulk S/D region 261. In some embodiments, dopant diffusion barrier layer 260 and S/D regions 261 can be formed using any suitable techniques, such as one or more of the deposition processes described herein (e.g., CVD, ALD, PVD, MBE), and/or any other suitable processes as will be apparent in light of this disclosure. In some such embodiments, dopant diffusion barrier layer 260 and/or S/D regions 261 may be formed using a selective deposition process, e.g., such that the material of the features only or significantly only grows (or only grows in a monocrystalline structure) from the exposed semiconductor material, as can be understood based on this disclosure.

Note that the S/D regions 261 are referred to herein as such for ease of description, but each S/D region may be either a source region or a drain region, such that the corresponding S/D region (on the other side of the channel region, and thus, on the other side of the dummy gate stack) is the other of the source region and drain region, thereby forming a source and drain region pair. For instance, as shown in FIG. 2H, there are four different S/D region 261 pairs. Further note that dopant diffusion barrier layer 260 as described herein may or may not be considered a portion of a given overall S/D region that includes both layer 260 and feature 261. However, for ease of description, the dopant diffusion barrier layer 260 will be referred to as such herein and bulk features 261 will be referred to as S/D regions 261 herein for ease of description, even though the dopant diffusion barrier layer may actually be a part of the overall S/D region. Regardless, the dopant diffusion barrier layer 260, in embodiments where present is located at the interface between a given S/D region and the corresponding Ge-rich channel region and can be utilized to help prevent dopant from undesirably diffusing into that Ge-rich channel region.

In some embodiments, alternative S/D processing may include if the S/D processing was only performed using process 114, such that process 112 is not performed, and thus, one or more dopant diffusion barrier elements are formed only in the bulk S/D region (and a dopant diffusion barrier layer is not formed). For instance, in such alternative S/D processing, continuing from the structure of FIG. 2F, the resulting example structure formed is FIG. 2G', in accordance with some embodiments. Note that dopant diffusion barrier layer 260 is absent from the structure of FIG. 2G', as the dopant diffusion barrier element(s) are present in S/D regions 262 instead. The relevant description of S/D regions 261 herein is equally applicable to S/D regions 262, except that S/D regions 262 include at least one dopant diffusion barrier element as variously described herein, such as alloying with relatively higher Si concentration (e.g., compared to the Ge-rich channel region), carbon, and/or tin. However, in some such embodiments, it may be desired to employ tin and/or a relatively higher Si concentration (e.g., compared to the Ge-rich channel region) as the dopant diffusion barrier element(s) in the bulk S/D region 262 to lower the diffusivity of that bulk S/D region 262, thereby making it less likely that dopant outwardly diffuses from the bulk S/D region into the adjacent channel region. In addition, another difference between S/D regions 261 and S/D regions 262 is that S/D regions 262 do not include dopant diffusion barrier layer 260 between those S/D regions 262 and respective channel regions, as can be understood based on this disclosure.

In some embodiments, further alternative S/D processing may include if the S/D processing includes both processes 112 and 114, such that both a dopant diffusion barrier layer 260 is formed and one or more dopant diffusion barrier elements are included in the S/D regions, such that S/D regions 262 are formed from dopant diffusion barrier layer 260 instead of S/D regions 261. For instance, in such further alternative S/D processing, continuing from the structure of FIG. 2G, the resulting example structure formed is FIG. 2H', in accordance with some embodiments. Note that where the one or more dopant diffusion barrier elements are located is indicated above each of FIGS. 2G, 2G', and 2H', which illustrate the three different configurations for S/D regions including one or more dopant diffusion barrier elements, as can be understood based on this disclosure. Further note that a multitude of configurations for the different S/D region features will be described in more detail herein with respect to FIGS. 3A-C, specifically, as they relate to 260/261 in FIG. 2H, 261 in FIG. 2G', and 260/262 in FIG. 2H', respectively.

In some embodiments, the S/D region features 260, 261, and 262 may include any suitable semiconductor material as will be apparent in light of this disclosure, such as monocrystalline group IV semiconductor material. For instance, a given S/D region (and its included features 260, 261, and/or 262) may include at least one of Si, Ge, Sn, and C. In some embodiments, a given S/D region (and its included features 260, 261, and/or 262) may or may not include n-type and/or p-type dopant (such as in one of the schemes described herein). For instance, where a dopant diffusion barrier layer 260 is employed, in some embodiments, that layer 260 includes dopant (e.g., B, As, or P) when formed, while in other embodiments, that layer 260 does not include dopant (e.g., B, As, or P). Where present, the dopant may be included in a concentration in the range of 1E17 to 5E22 atoms per cubic cm or greater, for example. In some embodiments, a given S/D region (and its included features 260, 261, and/or 262) may include grading (e.g., increasing and/or decreasing) of the concentration of one or more materials within the feature, such as the grading of a semiconductor material component concentration and/or the grading of the dopant concentration, for example. For instance, in some such embodiments, the dopant concentration included in a given S/D region may be graded such that it is lower near the corresponding channel region and higher near the corresponding S/D contact, which may be achieved using any suitable processing, such as tuning the amount of dopant in the reactant flow (e.g., during an in-situ doping scheme), to provide an example. In some embodiments, a given S/D (and its included features 260, 261, and/or 262) region may include a multilayer structure that includes at least two compositionally different material layers. For instance, in the case of a FFFET device, the source region may include a multilayer structure that includes a p-type doped region and n-type doped region, in accordance with some embodiments. In some embodiments, a given S/D region (and its included features 261 or 262) may be raised such that it extends higher than a corresponding channel region (e.g., in the vertical or Y-axis direction).

In some embodiments, S/D regions 261 and 262 may have different shapes and configurations, as will be apparent in light of this disclosure. For instance, in the example structures of FIGS. 2H and 2G', the S/D regions include three-dimensional diamond shapes, with two top surfaces that are faceted (e.g., with {111} faceting) as shown. To provide another example structure, FIG. 2G" is a blown-out portion of FIG. 2G', illustrating alternative S/D region 262' that may be formed, in accordance with some embodiments. As shown, S/D region 262' includes a rounded (or curved) and unfaceted top, and the rounded or curved S/D region 262' also extends past the underlying sub-fin portion 203 in the X-axis direction. As can be understood based on this disclosure, S/D regions including any shape (such as the diamond shape of S/D regions 261 and 262 or the rounded shape of S/D region 262') can benefit from the techniques described herein. Further note that FIG. 2G" also illustrates that a cladding scheme may be utilized for a given S/D region, such that native fins 204 (or replacement fin 230, where employed) may remain, at least in part, in a given final S/D region. For example, by not removing portions of fin 204 (or replacement fin 230, when employed) from the S/D regions, one or more cladding layers may be deposited on the fin to form the final S/D region. In the example embodiment of FIG. 2G", cladding layer 262' was formed on native fin 204 as shown to form the final S/D region. Thus, the final S/D regions can be formed using any suitable techniques and can include numerous different variations and configurations, as can be understood based on this disclosure. Note that the relevant description of S/D regions 262 herein (e.g., included materials and doping schemes) is equally applicable to feature 262'.

Note that the features of the S/D regions (e.g., 260, 261, and 262) are shown with patterning to merely assist with visual identification of the different features in the figures. Also note that features 260 and 262 are shown with the same cross-hatch patterning to indicate that both features include at least one dopant diffusion barrier element (e.g., relatively higher Si compared to the Ge-rich channel region, carbon, and/or tin). Also note that S/D region features 260, 261, and 262 are all shown as including the same sizes/shapes in the example structures, for ease of illustration; however, the present disclosure is not intended to be so limited. However, the patterning/shading of any of the features in the figures is not intended to limit the present disclosure in any manner. For example, in some embodiments, one of the S/D regions in a corresponding S/D region pair (such as region 261 on one side of the dummy gate stack) may be processed separately than the other S/D region in that pair (such as region 261 on the opposite side of the dummy gate stack), such that a corresponding S/D pair may include different material, dopant type, dopant concentration, sizes, shapes, and/or any other suitable difference as can be understood based on this disclosure. For instance, in the case of a TFET device, one of the S/D regions may include n-type doped semiconductor material and the other of the S/D regions may include p-type doped semiconductor material, to provide an example case, such that the n-type S/D region may be processed separately from the p-type S/D region. The separate processing may be achieved using any suitable techniques, such as masking off S/D regions not to be processed to allow processing of other S/D regions, and then masking off the other S/D regions to allow processing of the originally masked off S/D regions, for example. In some embodiments, a given S/D region may include the same or a similar material composition (e.g., within 1% different) as the corresponding/adjacent channel region (such as both including the same Ge-rich material). However, in other embodiments, a given S/D region may include a different material composition (e.g., at least 1, 2, 3, 4, 5, or 10% different) relative to the corresponding/adjacent channel region, for example.

Method 100 of FIG. 1 continues with performing 116 the final gate stack processing to form the example resulting structure of FIG. 2I, in accordance with some embodiments. As shown in FIG. 2I, the processing in this example embodiment included depositing interlayer dielectric (ILD) layer 270 on the structure of FIG. 2H, followed by planarization and/or polishing (e.g., CMP) to reveal the dummy gate stack. Note that ILD layer 270 is shown as transparent in the example structure of FIG. 2I to allow for the underlying features to be seen; however, the present disclosure is not intended to be so limited. Also note that ILD layer 270 may include a multilayer structure, even though it is illustrated as a single layer. Further note that in some cases, ILD layer 270 and STI material 220 may not include a distinct interface as shown in FIG. 2I, particularly where, e.g., the ILD layer 270 and STI material 220 include the same dielectric material (e.g., where both include silicon dioxide). In some embodiments, the ILD layer 270 may include any desired electrical insulator, dielectric, oxide (e.g., silicon oxide), and/or nitride (e.g., silicon nitride) material, as will be apparent in light of this disclosure.

The gate stack processing, in this example embodiment, continued with removing the dummy gate stack (including dummy gate 244 and dummy gate dielectric 242) to allow for the final gate stack to be formed. Recall that in some embodiments, the formation of the final gate stack, which includes gate dielectric 282 and gate electrode 284, may be performed using a gate first flow (also called up-front hi-k gate). In such embodiments, the final gate stack processing may have been alternatively performed at box 110, instead of forming a dummy gate stack. However, in this example embodiment, the final gate stack is formed using a gate last flow (also called a replacement gate or replacement metal gate (RMG) process). Regardless of whether gate first or gate last processing is employed, the final gate stack can include gate dielectric 282 and gate electrode 284 as shown in FIG. 2I and described herein.

Note that when the dummy gate is removed, the channel region of fins 204 (or replacement material fins 230), which is the portion of the fins that were covered by the dummy gate stack, are exposed to allow for any desired processing of those channel regions. Such processing of a given channel region may include various different techniques, such as removing and replacing the channel region with replacement material, doping the channel region as desired, forming the channel region into one or more nanowires (or nanoribbons) for a gate-all-around (GAA) transistor configuration, forming the channel region into a beaded-fin configuration, cleaning/polishing the channel region, and/or any other suitable processing as will be apparent in light of this disclosure. For instance, finned channel region 206 is illustrated (which is the channel region of the right-most of the four original finned structures) and that finned channel region may be a portion of native fin 204 and/or it may have been processed in any suitable manner (e.g., removed and replaced with other replacement material, doped in a desired manner, etc.). To provide another example, replacement material channel region 230 (which is the channel region of the second right-most of the four original finned structures) is a portion of replacement material fin 230 shown in FIGS. 2C' and 2D' and described herein.

To provide yet another example, nanowire channel region 208 (which is the channel region of the left-most of the four original finned structures) may have been formed after the dummy gate was removed and the channel regions of the fins were exposed, by converting the finned structure at that location into the nanowires 208 shown using any suitable techniques, for example. For instance, the original finned channel region may have included a multilayer structure, where one or more of the layers were sacrificial and selective etch processing is performed to remove those sacrificial layers and release the nanowires 208. As shown in FIG. 2I, nanowire channel region 208 includes 2 nanowires (or nanoribbons) in this example case. However, a nanowire (or nanoribbon or GAA) transistor formed using the techniques disclosed herein may include any number of nanowires (or nanoribbons) such as 1, 3, 4, 5, 6, 7, 8, 9, 10, or more, depending on the desired configuration. In some embodiments, a nanowire or nanoribbon may be considered fin-shaped where the gate stack wraps around each fin-shaped nanowire or nanoribbon in a GAA transistor configuration. To provide yet another example, beaded-fin channel region 207 (which is the channel region of the second left-most of the four original finned structures) is a hybrid between finned channel region 230 and nanowire channel region 208, where the sacrificial material (shown with grey shading) that may have been completely removed to release nanowires 208 was instead only partially removed to form the resulting beaded-fin structure 207 shown. Such a beaded-fin channel region structure may benefit from, for instance, increased gate control (e.g., compared to finned channel region structure 230) while also having, for instance, relatively reduced parasitic capacitance (e.g., compared to nanowire channel region structure 208). Therefore, numerous different channel region configurations can benefit from the dopant diffusion barrier techniques described herein, as can be understood based on this disclosure.

In some embodiments, a given channel region of a transistor device (e.g., channel region 206, 230, 207, 208) may include monocrystalline Ge-rich group IV semiconductor material, such as monocrystalline Ge or monocrystalline SiGe with at least 50% Ge by atomic percentage, and/or any other suitable material as will be apparent in light of this disclosure. In general, a given channel region may include at least one of silicon (Si) and germanium (Ge), to provide some examples. In some embodiments, the channel region may be doped (e.g., with any suitable n-type and/or p-type dopant) or intrinsic/undoped (or nominally undoped, with a dopant concentration less than 1E16 atoms per cubic cm), depending on the particular configuration. In some embodiments, a given channel region may include grading (e.g., increasing and/or decreasing) of the concentration of one or more materials within the feature, such as the grading of a semiconductor material component concentration and/or the grading of the dopant concentration, for example. In some embodiments, a given channel region may include a multi-layer structure that includes at least two compositionally different material layers (such as is the case for beaded-fin transistor configuration 207). As can be understood based on this disclosure, the channel region is at least below the gate stack, in this example embodiment. For instance, in the case of a finned transistor configuration, the channel region may be below and between the gate stack, as the stack is formed on three sides as is known in the art. However, if the transistor device were inverted and bonded to what will be the end substrate, then the channel region may be above the gate. Therefore, in general, the gate structure and channel region may include a proximate relationship, where the gate structure is near the channel region such that it can exert control over the channel region in an electrical manner, in accordance with some embodiments. Further, in the case of a nanowire (or nanoribbon or GAA) transistor configuration, the gate stack may completely surround each nanowire/nanoribbon in the channel region (or at least substantially surround each nanowire, such as surrounding at least 70, 80, or 90% of each nanowire). Further still, in the case of a planar transistor configuration, the gate stack may simply be above the channel region.

Note that the S/D regions (which may include features 260, 261 and/or 262) are adjacent to either side of a corresponding channel region, such as can be seen in FIG. 2I, for example. More specifically, the S/D regions 261 are not directly adjacent to a corresponding channel region, as dopant diffusion barrier layer 260 is present between each S/D region 261 and its corresponding channel region, in this example embodiment. However, in other embodiments, a given S/D region may be directly adjacent a given channel region (such as is the case of S/D regions 262 in FIG. 2G', for example). Also note that the configuration/geometry of a transistor formed using the techniques described herein may primarily be described based on the shape of the respective channel region of that transistor. For instance, a nanowire (or nanoribbon or GAA) transistor may be referred to as such because it includes one or more nanowires (or nanoribbons) in the channel region of that transistor and because the gate stack (including the gate) wraps around (or at least substantially wraps around) each nanowire (or nanoribbon). However, the transistor type (e.g., MOSFET, TFET, FFFET, or other suitable type) may be described based on the doping and/or operating scheme of the source, channel, and drain regions, and thus those respective regions may be used to determine the type or classification of a given transistor, for example. For instance, MOSFET and TFET transistors may structurally be very similar (or the same), but they include different doping schemes (e.g., source-drain doping schemes for MOSFET of p-p or n-n versus p-n or n-p for TFET).

Continuing with performing 116 final gate stack processing, after the dummy gate has been removed and any desired channel region processing has been performed, the final gate stack can then be formed, in accordance with some embodiments. In this example embodiment, the final gate stack includes gate dielectric 282 and gate electrode 284, as shown in FIG. 2G. The gate dielectric 282 may include, for example, any suitable oxide (such as silicon dioxide), high-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. In some embodiments, an annealing process may be carried out on the gate dielectric 282 to improve its quality when high-k dielectric material is used. The gate electrode 284 may include a wide range of materials, such as polysilicon or various suitable metals or metal alloys, such as aluminum (Al), tungsten (W), titanium (Ti), tantalum (Ta), copper (Cu), titanium nitride (TiN), or tantalum nitride (TaN), for example. In some embodiments, gate dielectric 282 and/or gate electrode 284 may include a multilayer structure of two or more material layers, for example. In some embodiments, gate dielectric 282 and/or gate electrode 284 may include grading (e.g., increasing and/or decreasing) the content/concentration of one or more materials in at least a portion of the feature(s). Additional layers may be present in the final gate stack, in some embodiments, such as one or more work-function layers or other suitable layers, for example. Note that although gate dielectric 282 is only shown below gate electrode 284 in the example embodiment of FIG. 2G, in other embodiments, the gate dielectric 282 may also be present on one or both sides of gate electrode 284, such that the gate dielectric 282 may also be between gate electrode 284 and one or both of spacers 250, for example. Numerous different gate stack configurations will be apparent in light of this disclosure.

Figure 2J:
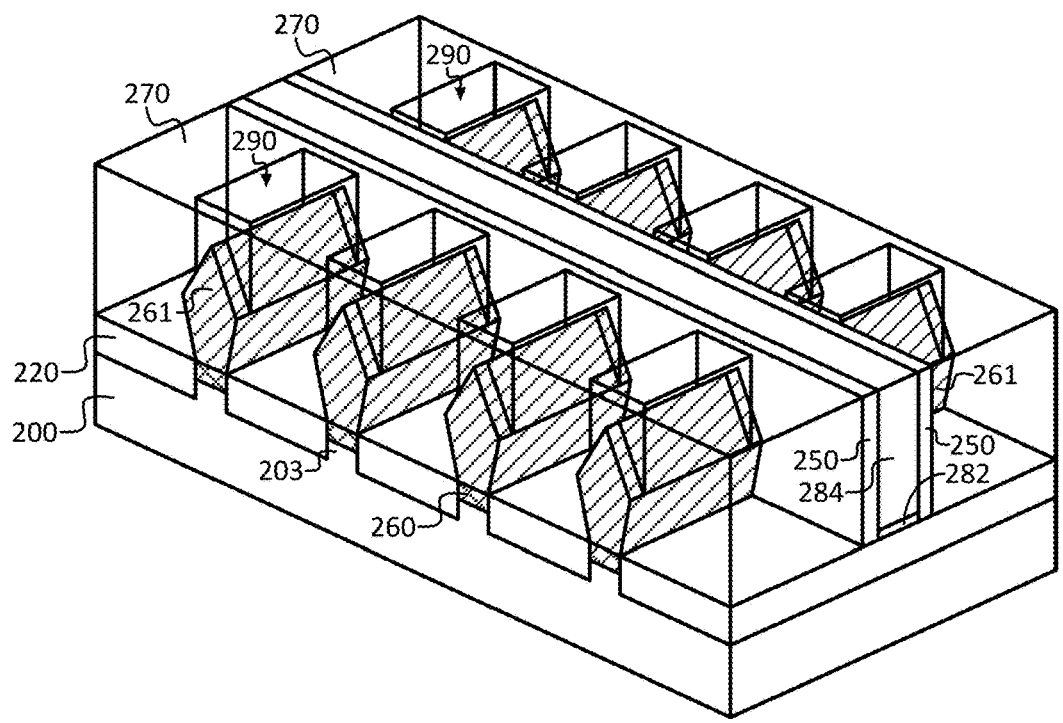
Figure 2K:
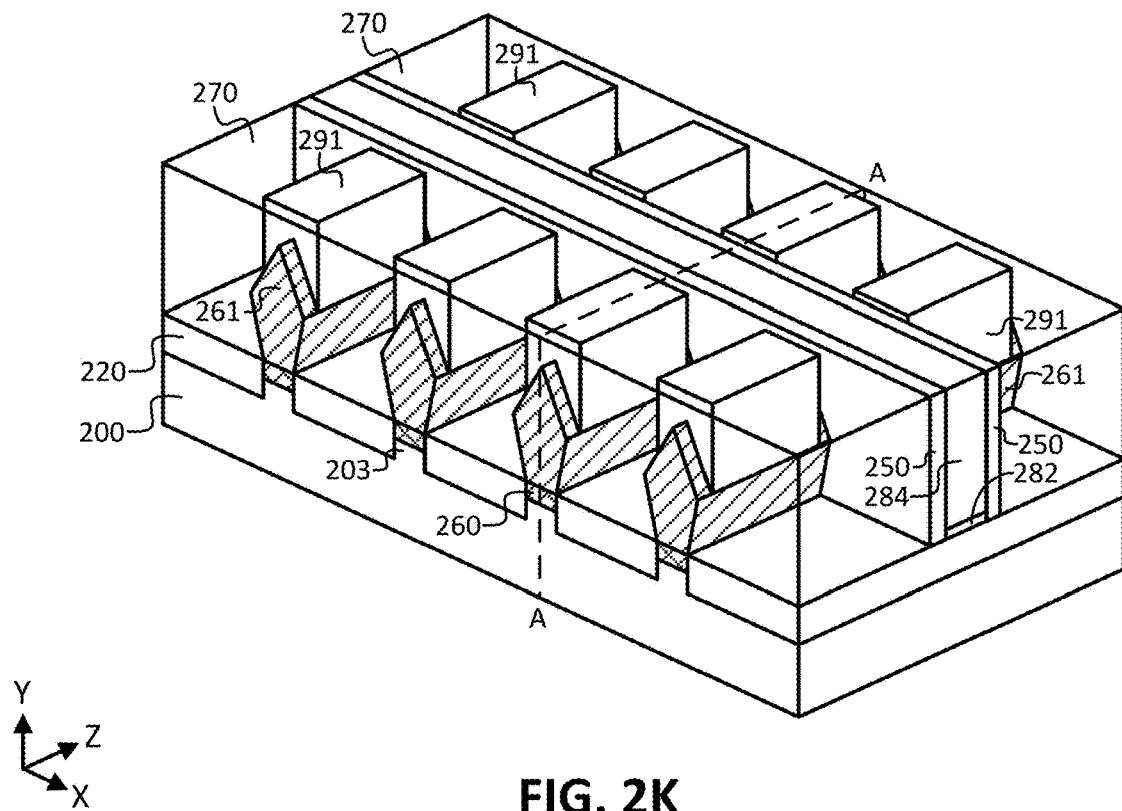

Method 100 of FIG. 1 continues with performing 118 S/D contact processing to form the example resulting structure of FIG. 2K, in accordance with some embodiments. S/D contact processing 118, in this example embodiment, first included forming S/D contact trenches 290 above the S/D regions 261, as shown in FIG. 2J. In some such embodiments, the contact trenches 290 may be formed using any suitable techniques, such as performing one or more wet and/or dry etch processes to remove portions of ILD layer 270 as shown, and/or any other suitable processing as will be apparent in light of this disclosure. Such etch processing may be referred to as the S/D contact trench etch processing, or simply, contact trench etch processing. Further, in some such embodiments, the ILD may first be patterned such that areas that are not to be removed via the contact trench etch processing are masked off, for example. In some embodiments, one or more etch stop layers may have been formed on S/D regions 261 prior to performing the contact trench etch processing, to help with the controllability of the processing (e.g., to help stop the etching to help prevent the etching from consuming material of the S/D regions 261 in an undesired manner). In some such embodiments, the etch stop layer(s) may include insulator material that is dissimilar from the ILD 270 material (e.g., to provide relative etch selectivity) and/or material that that is resilient to the contact trench etch, such as a carbon-based etch stop layer (e.g., with carbon concentration in the range of 1-80%).

Continuing from the example structure of FIG. 2H to the example structure of FIG. 2I, S/D contact processing 118 includes forming S/D contacts 291 above respective S/D regions 261, in accordance with some embodiments. In the example structure of FIG. 2I, it can be understood that S/D contacts 291 are electrically connected to S/D regions 261, and in some cases, they may also be in physical contact with those S/D regions 261. In some embodiments, S/D contacts 291 may be formed using any suitable techniques, such as depositing metal or metal alloy (or other suitable electrically conductive material) in contact trenches 290. In some embodiments, S/D contact 291 formation may include silicidation, germanidation, and/or annealing processes, for example, where such processing may be performed to form an intervening contact layer before forming the bulk contact metal structure, for instance. In some embodiments, S/D contacts 291 may include aluminum or tungsten, although any suitable conductive metal or alloy can be used, such as silver, nickel-platinum, or nickel-aluminum, for example. Generally, in some embodiments, one or more of the S/D contacts 291 may include a resistance reducing metal and a contact plug metal, or just a contact plug, for instance. Example contact resistance reducing metals include, for instance, nickel, aluminum, titanium, gold, gold-germanium, nickel-platinum, or nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, S/D contacts 291 may employ low work-function metal material(s) and/or high work-function metal material(s), depending on the particular configuration. In some embodiments, additional layers may be present in the S/D contact regions, such as adhesion layers (e.g., titanium nitride) and/or liner or barrier layers (e.g., tantalum nitride), if so desired.

Figure 3A:
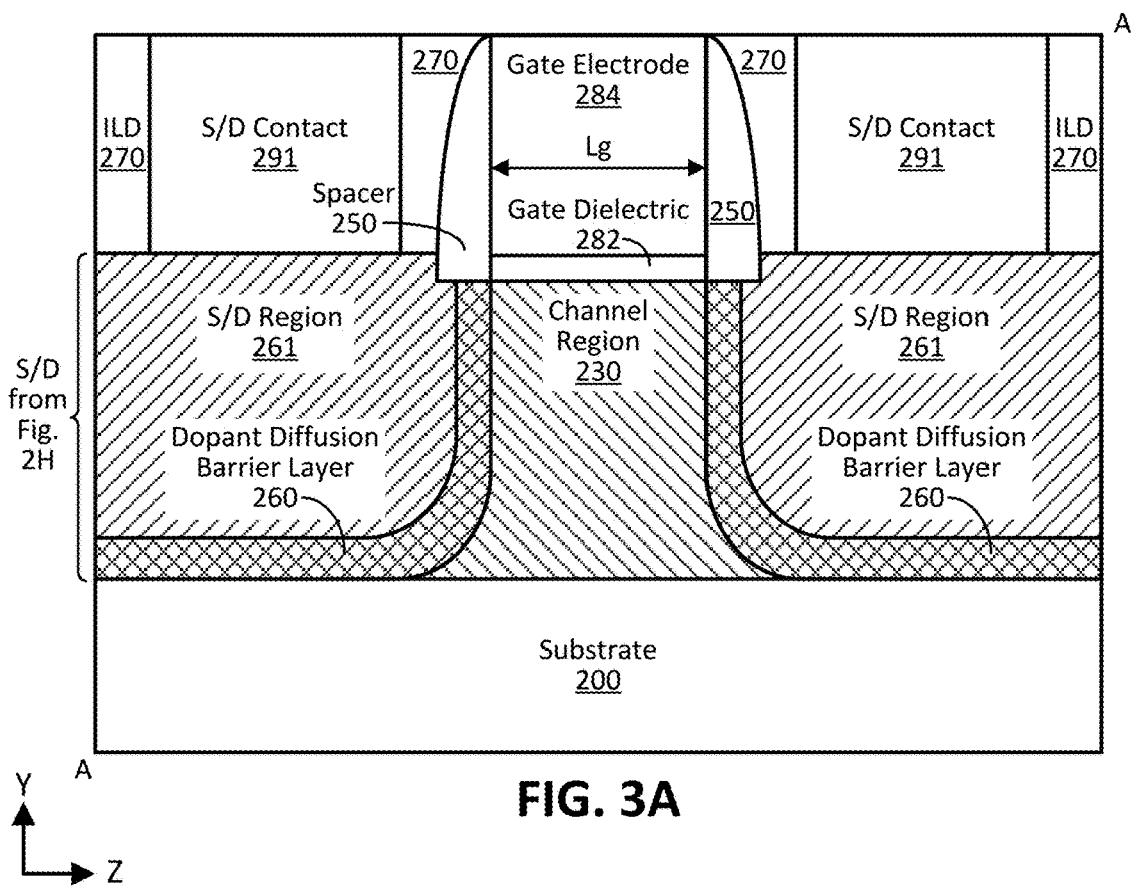
FIG. 3A illustrates an example cross-sectional view along the plane A-A in FIG. 2K, in accordance with some embodiments.
Figure 3B:
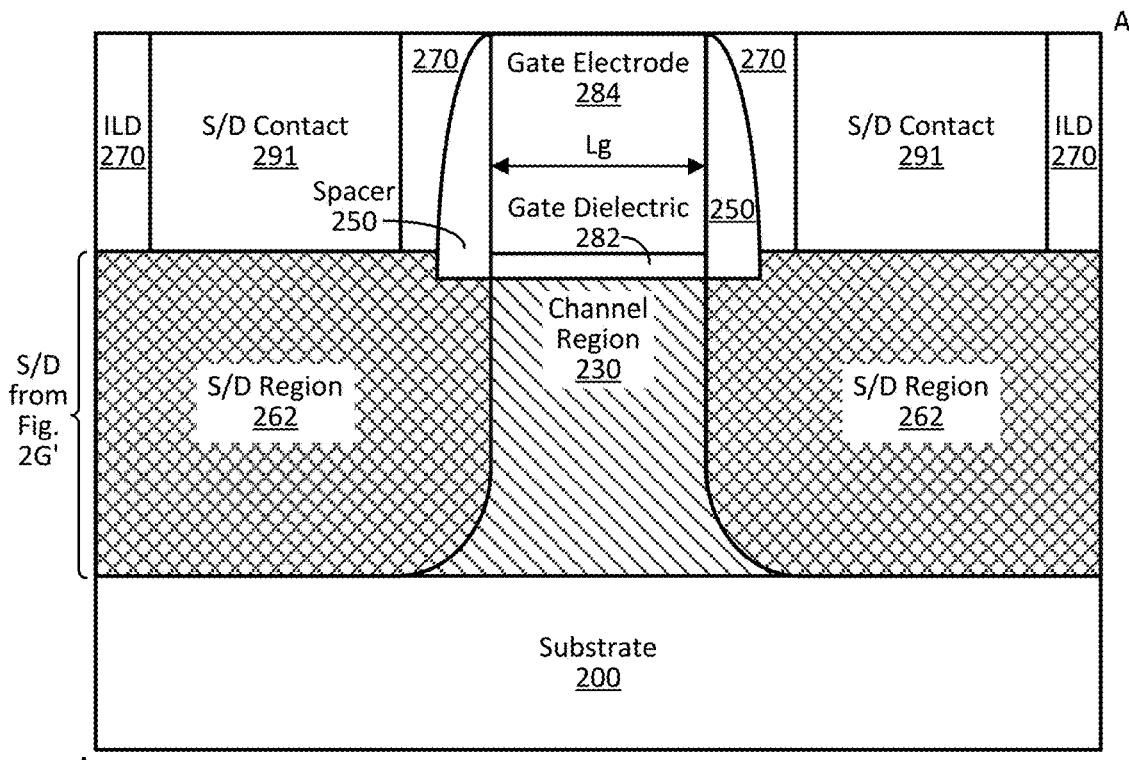
FIG. 3B illustrates the example cross-sectional view of FIG. 3A with the S/D scheme from FIG. 2G', in accordance with some embodiments.
Figure 3C:
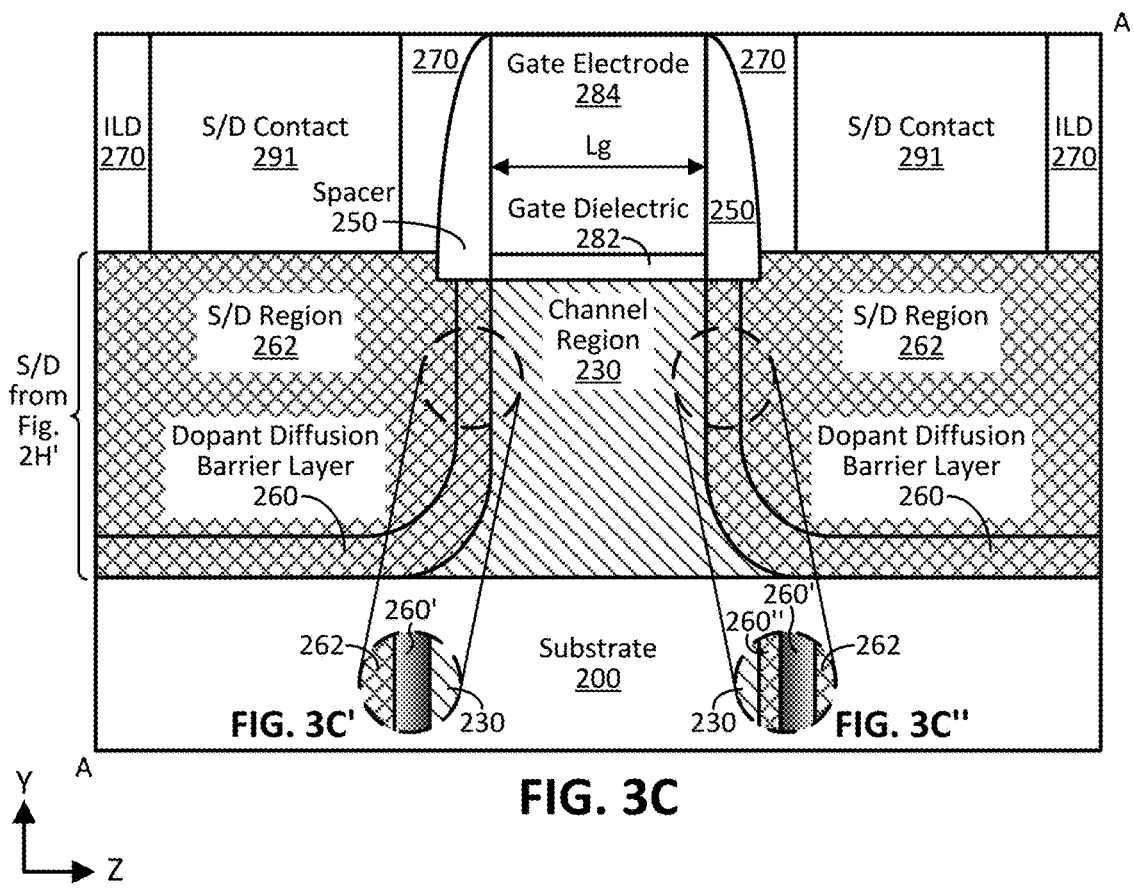
FIG. 3C illustrates the example cross-sectional view of FIG. 3A with the S/D scheme from FIG. 2H', in accordance with some embodiments.

FIG. 3A illustrates an example cross-sectional view along the plane A-A in FIG. 2K, in accordance with some embodiments. The cross-sectional view of FIG. 3A is provided to assist in illustrating different features of the structure of FIG. 2K. Therefore, the relevant description with respect to each similarly numbered feature is equally applicable to FIG. 3A. However, note that the dimensions of the features shown in FIG. 3A may differ relative to the features in FIG. 2K, for ease of illustration. Also note that some variations occur between the structures, such as the shape of spacers 250 and the shape of finned channel region 230, for example. Further note that channel region 230 shown in FIG. 3A is not native to substrate 200; however, in other embodiments, the channel region (and thus, the material of that channel region) may be native to substrate 200. Further still, note that the particular S/D configuration employed in the structure of FIG. 3A is the same S/D configuration from FIG. 2H (as indicated to the left of the structure of FIG. 3A), such that the one or more dopant diffusion elements are located only in dopant diffusion barrier layer 260 (and thus, not in S/D regions 261). FIG. 3B illustrates the example cross-sectional view of FIG. 3A with the S/D scheme from FIG. 2G', in accordance with some embodiments. FIG. 3C illustrates the example cross-sectional view of FIG. 3A with the S/D scheme from FIG. 2H', in accordance with some embodiments. As is the case for FIG. 3A where the S/D scheme is indicated on the left side of the structure, the respective S/D schemes for the structures of FIGS. 3B and 3C are also indicated on the left side of those structures.

In the embodiment of FIG. 3A, S/D regions 261 do not include carbon or tin, and the regions 261 also do not include a Si concentration by atomic percentage that is relatively greater than the Si content of Ge-rich S/D channel region 230. For instance, in some embodiments, S/D regions 261 and channel region 230 may both include Ge or SiGe with approximately the same Si concentration by atomic percentage (and thus, approximately the same Ge concentration by atomic percentage). In other embodiments, S/D regions 261 may include less Si by atomic percentage than channel region 230, such as in the case where S/D regions 261 include Ge and channel region 230 includes SiGe. However, dopant diffusion barrier layer 260 does include at least one of carbon, tin, and relatively higher Si concentration (e.g., at least 10% higher) by atomic percentage compared to the Ge-rich material of channel region 230. Therefore, the dopant diffusion barrier benefits can be derived from that layer 260, in the structure of FIG. 3A. Note that as shown in FIGS. 3A and 3C, layer 260 is a conformal layer that tracks the topology of the surfaces on which it was formed. Thus, in embodiments where it is present, the thickness of the layer 260 between the channel region and a given S/D region (e.g., one of S/D regions 261 or 262) may be the same as (or approximately the same as) the thickness of the layer 260 between the given S/D region and substrate 200, which is the case in FIGS. 3A and 3C.

Recall that cross-hatch patterning is used in the figures to assist with visually indicating the features of the structures that include one or more dopant diffusion barrier elements as described herein (e.g., included carbon, tin, and/or silicon to help prevent undesired dopant diffusion into the channel region). However, two features having common patterning/shading do not also share any other properties, such as materials, dimensions, shapes, and so forth, unless explicitly stated otherwise. For instance, dopant diffusion barrier layer 260 in FIG. 3C clearly includes a different shape than S/D regions 262, and they features 260 and 262 may also include different monocrystalline group IV semiconductor materials, different dopants, different dopant concentrations, and/or any other variation as will be apparent in light of this disclosure. An explicit statement to the otherwise might include, for example, stating that both dopant diffusion barrier layer 260 and S/D regions 262 include carbon, which would explicitly indicate that both of the features 260 and 262 include carbon (which was not otherwise the case).

In some embodiments, undesired dopant diffusion into a Ge-rich channel region may be reduced based on the relative concentration of Si in a given S/D region as compared to the Ge-rich channel region. For instance, for a SiGe S/D region, even relatively small increases in Si atomic percentage reduces the diffusivity of the dopant included in that S/D region. For example, for Ge channel transistors, such as Ge channel n-MOS, Ge S/D may be replaced with SiGe S/D to significantly reduce the amount of dopant (e.g., P or As) that diffuses into the Ge-rich channel region during subsequent processing after the n-type doped SiGe S/D is formed (e.g., during various thermal events, such as anneals, that occur post-S/D processing). In such an example case, even 10% greater Si concentration in a given SiGe S/D region can have a dopant diffusion barrier impact, such as in an example case of a Ge channel and a $Si_{0.1}Ge_{0.9}$ S/D (in other words, SiGe with 10% Si by atomic percentage). Thus, in some embodiments, a given S/D region, such as feature 260 and/or 262, may have relatively more Si concentration than its corresponding Ge-rich channel region, such as channel region 230, to help prevent dopant diffusion from the given S/D region into the Ge-rich channel region. In some such embodiments, the S/D region may include 10-100% more Si (or 10-100% less Ge) by atomic percentage than the corresponding Ge-rich channel. Further, in some such embodiments where the relative difference in Si (or Ge) concentration is used as a dopant diffusion barrier, a given S/D region may include at least 10, 15, 20, 25, 30, 35, 40, 45, 50, 60, 70, 80, or 90% more Si concentration (or less Ge concentration) by atomic percentage than the corresponding Ge-rich channel region. By way of example, if the S/D region 262 included at least 20% more Si concentration (or at least 20% less Ge concentration) by atomic percentage than Ge-rich channel region 230, in the case of that channel region 230 including Ge, S/D region 262 may include SiGe with at least 20% Si concentration by atomic percentage all the way up to Si (such that there is no significant Ge content in that S/D region), while in the case of the channel region 230 including SiGe having 80% Ge concentration (and 20% Si concentration, or in other words, $Si_{0.2}Ge_{0.8}$), S/D region 262 may include SiGe with at least 40% Si concentration by atomic percentage all the way up to Si (such that there is no significant Ge content in that S/D region).

In some embodiments, undesired dopant diffusion into a Ge-rich channel region (such as channel region 230) may be reduced based on the inclusion of carbon into a corresponding S/D region, whether it be included as a carbon-based dopant diffusion barrier layer (such as layer 260 in FIG. 3A) at the interface between the S/D region and the Ge-rich channel region, as a carbon alloy component included in at least a majority (or essentially the entirety) of the S/D region (such as in S/D regions 262 in FIG. 3B), or a combination of the two (such as in layer 260 and S/D regions 262 in FIG. 3C). In embodiments where carbon is employed in dopant diffusion barrier layer 260, the carbon-based dopant diffusion barrier interfacial layer may include a thickness (dimension in the Z-axis direction between the S/D region 261 or 262 and channel region 230) in the range of 0.5-10 nm (or in a subrange of 0.5-1, 0.5-2, 0.5-3, 0.5-5, 0.5-8, 1-2, 1-3, 1-5, 1-8, 1-10, 2-3, 2-5, 2-8, 2-10, 3-5, 3-8, 3-10, or 5-10 nm) or greater, for example. Further, in embodiments where dopant diffusion barrier layer 260 includes carbon, the carbon-based dopant diffusion barrier layer includes non-carbon group IV semiconductor material alloyed with the carbon, such as Si:C, SiGe:C, Ge:C, SiSn:C, SiGeSn:C, or GeSn:C, for example. Thus, in some embodiments, the carbon concentration (by atomic percentage) included in a carbon-based interfacial dopant diffusion barrier layer may be in the range of 1E19 atoms per cubic cm to 20% by atomic percentage (or in a subrange of 1E19 atoms per cubic cm to 5%, 1E19 atoms per cubic cm to 10%, 1-5%, 1-10%, 1-20%, 2-5%, 2-10%, 2-20%, 5-10%, 5-20%, or 10-20%) or greater, for example. For instance, a carbon-based dopant diffusion barrier layer that includes silicon germanium alloyed with carbon and has a silicon concentration of 40% (by atomic percentage), a germanium concentration of 50% (by atomic percentage) and a carbon concentration of 10% (by atomic percentage) may be represented herein as $Si_{0.4}Ge_{0.5}:C_{0.1}$, to provide an example.

In embodiments where carbon is alloyed into at least a majority of a given S/D region (such as S/D regions 262), carbon may be present in at least 50, 60, 70, 80, 90, or 95% of the given S/D region. In some embodiments, where carbon is alloyed into at least a majority of a given S/D region (such as S/D regions 262), carbon may be throughout essentially the entirety of the S/D region. In embodiments where carbon is alloyed into at least a majority of a given S/D region, such as at least a majority of S/D regions 262, it may be alloyed in a concentration of 1E19 atoms per cubic cm to 5% by atomic percentage (or in a subrange of 1E19 atoms per cubic cm to 1%, 1E19 atoms per cubic cm to 2%, 1E19 atoms per cubic cm to 3%, 1E19 atoms per cubic cm to 4%, 1-2%, 1-3%, 1-4%, 1-5%, 2-3%, 2-4%, 2-5%, 3-4%, 3-5%, or 4-5%), so as to achieve dopant diffusion barrier benefits and thereby help prevent short channel effects, without undesirably sacrificing other transistor performance areas (such as adversely affecting S/D resistance). In some embodiments, interfacial dopant diffusion barrier layer 260 (where employed) may include a relatively higher concentration of carbon and/or tin for relatively thinner layers, and vice versa, a relatively lower concentration of carbon and/or tin for relatively thicker layers, such that the concentration of the dopant barrier element(s) may be adjusted according to the thickness of the layer. Generally, where carbon is alloyed with two or more non-carbon group IV elements, such as with SiGe (e.g., as SiGe:C), any suitable concentrations of those two or more elements may be selected, unless explicitly stated otherwise. By way of example, SiGe:C with 5% carbon concentration by atomic percentage leaves 95% of atomic percentage for the Si and Ge components, such that the alloy may include up to 95% Si concentration (or up to 95% Ge concentration), for example.

In some embodiments, interfacial dopant diffusion barrier layer (where employed) may include a multilayer structure and/or include grading (e.g., increasing and/or decreasing) of the concentration of at least one material component through at least a portion of the layer. For instance, FIG. 3C' is a blown-out portion of FIG. 3C illustrating graded dopant diffusion barrier layer 260', in accordance with some embodiments. For example, a given graded dopant diffusion barrier layer 260' may be grown starting out with a relatively high carbon concentration followed by decreasing the carbon in the composition of the growth material until it is removed completely, such that the carbon concentration is graded throughout the dopant diffusion barrier layer 260' and has the relatively highest concentration near the Ge-rich channel region 230 and relatively lowest concentration near the remainder of the S/D region (S/D region 262, in the example case of FIG. 3C'). Further, FIG. 3C" is a blown-out portion of FIG. 3C illustrating a multilayer dopant diffusion barrier layer including first layer 260" and second graded layer 260', in accordance with some embodiments. For instance, in an example embodiment, first layer may include Si:C and second graded layer 260' may include a graded SiGe layer (e.g., a SiGe:B layer, in the case of a p-type doped S/D region, such as for a p-MOS device) that increases the Ge concentration as it is grown from the portion nearest the channel region 230 to the portion nearest S/D region 262, in the example structure of FIG. 3C". In yet another example embodiment, a Si:C layer may be formed on the Ge-rich channel region followed by a Si layer (e.g., a Si:B layer, in the case of a p-type doped S/D region) followed by formation of the bulk SiGe S/D material (e.g., SiGe:B, in the case of a p-type doped S/D region). In still another example embodiment, a SiGe:C layer may be formed on the Ge-rich channel region followed by the formation of the bulk SiGe S/D material (e.g., SiGe:P, in the case of an n-type doped S/D region, such as for an n-MOS device). Numerous different configurations and variations for employing dopant diffusion barrier elements for a Ge-rich channel region will be apparent in light of this disclosure.

In some embodiments, undesired dopant diffusion into a Ge-rich channel region (such as channel region 230) may be reduced based on the inclusion of tin into a corresponding S/D region, whether it be included as a tin-based dopant diffusion barrier layer (such as layer 260 in FIG. 3A) at the interface between the S/D region and the Ge-rich channel region, as a tin alloy component included in at a majority (or essentially the entirety) of the S/D region (such as in S/D regions 262 in FIG. 3B), or a combination of the two (such as in layer 260 and S/D regions 262 in FIG. 3C). Recall that the dopant diffusion barrier layer (where employed) and/or the bulk material in the S/D region may also or alternatively include carbon and/or relatively increased Si concentrations (compared to the Si concentration of the Ge-rich channel region) to help prevent undesired dopant diffusion. Thus, in some embodiments one, two, or all three of the element-based (carbon-based, tin-based, and/or relatively higher Si-based) schemes may be employed to help prevent the undesired diffusion of dopant (e.g., B, P, or As) from a given S/D region (e.g., S/D region 261 or 262) into its corresponding Ge-rich channel region (e.g., channel region 230), as can be understood based on this disclosure.

In embodiments where tin is employed in dopant diffusion barrier layer 260, the tin-based dopant diffusion barrier interfacial layer may include a thickness in the range of 0.5-30 nm (or in a subrange of 0.5-2, 0.5-5, 0.5-10, 0.5-20, 1-2, 1-5, 1-10, 1-20, 1-30, 2-5, 2-10, 2-20, 2-30, 5-10, 5-20, 5-30, 10-20, 10-30, or 20-30 nm) or greater, for example. For instance, in some such embodiments, the thickness may be selected to be at least 5, 10, 15, or 20 nm so as to provide desired dopant diffusion barrier properties, particularly where the dopant diffusion barrier layer only utilizes tin as the dopant diffusion barrier element (e.g., a GeSn dopant diffusion barrier interfacial layer for a Ge channel). Further, in embodiments where tin is employed in dopant diffusion barrier layer 260, the tin-based dopant diffusion barrier layer includes non-tin group IV semiconductor material alloyed with the tin, such as SiSn, SiGeSn, GeSn, SiSn:C, SiGeSn:C, or GeSn:C, for example. Thus, in some embodiments, the tin concentration (by atomic percentage) included in a tin-based interfacial dopant diffusion barrier layer may be in the range of, for example, 1-6% (or in a subrange of 1-2, 1-3, 1-4, 1-5, 2-3, 2-4, 2-5, 2-6, 3-4, 3-5, 3-6, 4-5, 4-6, or 5-6%), or any other suitable value or range as will be apparent in light of this disclosure.

In embodiments where tin is alloyed into at least a majority of a given S/D region (such as S/D regions 262), tin may be present in at least 50, 60, 70, 80, 90, or 95% of the given S/D region. In some embodiments, where tin is alloyed into at least a majority of a given S/D region (such as S/D regions 262), tin may be throughout essentially the entirety of the S/D region. In embodiments where tin is alloyed into at least a majority of a given S/D region (such as S/D regions 262), it may be alloyed in a concentration (by atomic percentage) of, for example, 1-6% (or in a subrange of 1-2, 1-3, 1-4, 1-5, 2-3, 2-4, 2-5, 2-6, 3-4, 3-5, 3-6, 4-5, 4-6, or 5-6%), or any other suitable value or range as will be apparent in light of this disclosure. Such a relatively low concentration may be selected so as to achieve dopant diffusion barrier benefits and thereby help prevent short channel effects, without undesirably sacrificing other transistor performance areas (such as adversely affecting S/D resistance, the melting temperature of the S/D material, and/or the lattice constant of the material of the S/D region that could thereby cause undesired lattice mismatch).

Note that the thickness and/or concentration of the tin-based dopant diffusion barrier layer may be selected based on whether or not other dopant diffusion barrier elements are included in that barrier layer and/or whether or not tin or other dopant diffusion barrier elements are included in the bulk S/D region, in accordance with some embodiments. For example, in embodiments where a tin-based dopant diffusion barrier layer also includes carbon, that tin and carbon-based layer may be formed in a relatively thinner manner compared to where the tin-based layer does not include carbon, while still achieving the same dopant diffusion barrier effects. Also note that the concentration of the tin alloy in a given S/D region, when included as a dopant diffusion barrier element, may be relatively less when a carbon-based dopant diffusion barrier layer is present at the interface between that tin-alloyed S/D region and the Ge-rich channel region. This is generally the case for any dopant diffusion scheme employed herein, where utilizing two or all three of the carbon, tin, and relatively higher Si content (as compared to the Ge-rich channel region) dopant diffusion elements in a given S/D region may improve the dopant diffusion barrier effect as compared to just employing one of them, and thus, smaller thicknesses and/or concentrations may be selected while still achieving the same dopant diffusion barrier effects, as can be understood based on this disclosure.

In some embodiments, the length of gate electrode 284 (e.g., the dimension between spacers 250 in the Z-axis direction), which is indicated as Lg in FIGS. 3A-C, may be any suitable length as will be apparent in light of this disclosure. For instance, in some embodiments, the gate length may be in the range of 3-100 nm (e.g., 3-10, 3-20, 3-30, 3-50, 5-10, 5-20, 5-30, 5-50, 5-100, 10-20, 10-30, 10-50, 10-100, 20-30, 20-50, 20-100, or 50-100 nm) or greater, for example. In some embodiments, the gate length may be less than a given threshold, such as less than 100, 50, 45, 40, 35, 30, 25, 20, 15, 10, 8, or 5 nm, or less than some other suitable threshold as will be apparent in light of this disclosure. In some embodiments, the techniques enable maintaining a desired device performance when scaling to such low thresholds, such as sub-50, sub-40, sub-30, or sub-20 nm thresholds, as can be understood based on this disclosure. For instance, the techniques as variously described herein can reduce short channel effects, thereby increasing the effective channel length (dimension between the S/D regions in the Z-axis direction). Further, the techniques described herein may allow the gate length and the effective channel length to be the same or approximately the same, in accordance with some embodiments. For instance, in some such embodiments, being approximately the same with respect to the effective channel length and the gate length may include that the effective channel length is within 1-10 nm (e.g., within 1, 2, 3, 4, 5, 6, 7, 8, 9, or 10 nm) or within 1-10% (e.g., within 1, 2, 3, 4, 5, 6, 7, 8, 9, or 10%) different (e.g., shorter) than the gate length. Thus, the gate length may approximate the effective channel length, in some such embodiments, especially where the dopant diffusion barrier techniques described herein essentially prevent dopant from diffusing into the channel region.

Method 100 of FIG. 1 continues with completing 120 integrated circuit (IC) processing as desired, in accordance with some embodiments. Such additional processing to complete the IC may include back-end or back-end-of-line (BEOL) processing to form one or more metallization layers and/or to interconnect the transistor devices formed during front-end or front-end-of-line (FEOL) processing, for example. Any other suitable processing may be performed, as will be apparent in light of this disclosure. Note that the processes 102-120 of method 100 are shown in a particular order for ease of description. However, one or more of the processes 102-120 may be performed in a different order or may not be performed at all. For example, box 110 is an optional process that need not be performed in embodiments employing a gate first process flow, for example. Further, only one of processes 112 and 114 or both of the processes may be performed, depending on the particular embodiment of method 100 employed. Recall that the techniques may be used to form a multitude of different transistor types and configurations. Although the techniques are primarily depicted and described herein in the context of employing one or more dopant diffusion barrier elements for both of the S/D regions of a given transistor, the present disclosure is not intended to be so limited, as the techniques may be used to benefit only one S/D region of a given transistor (and thus, only one side of a given channel region), and not the other, in some embodiments. Numerous variations and configurations will be apparent in light of the present disclosure.

Example System

Figure 4:
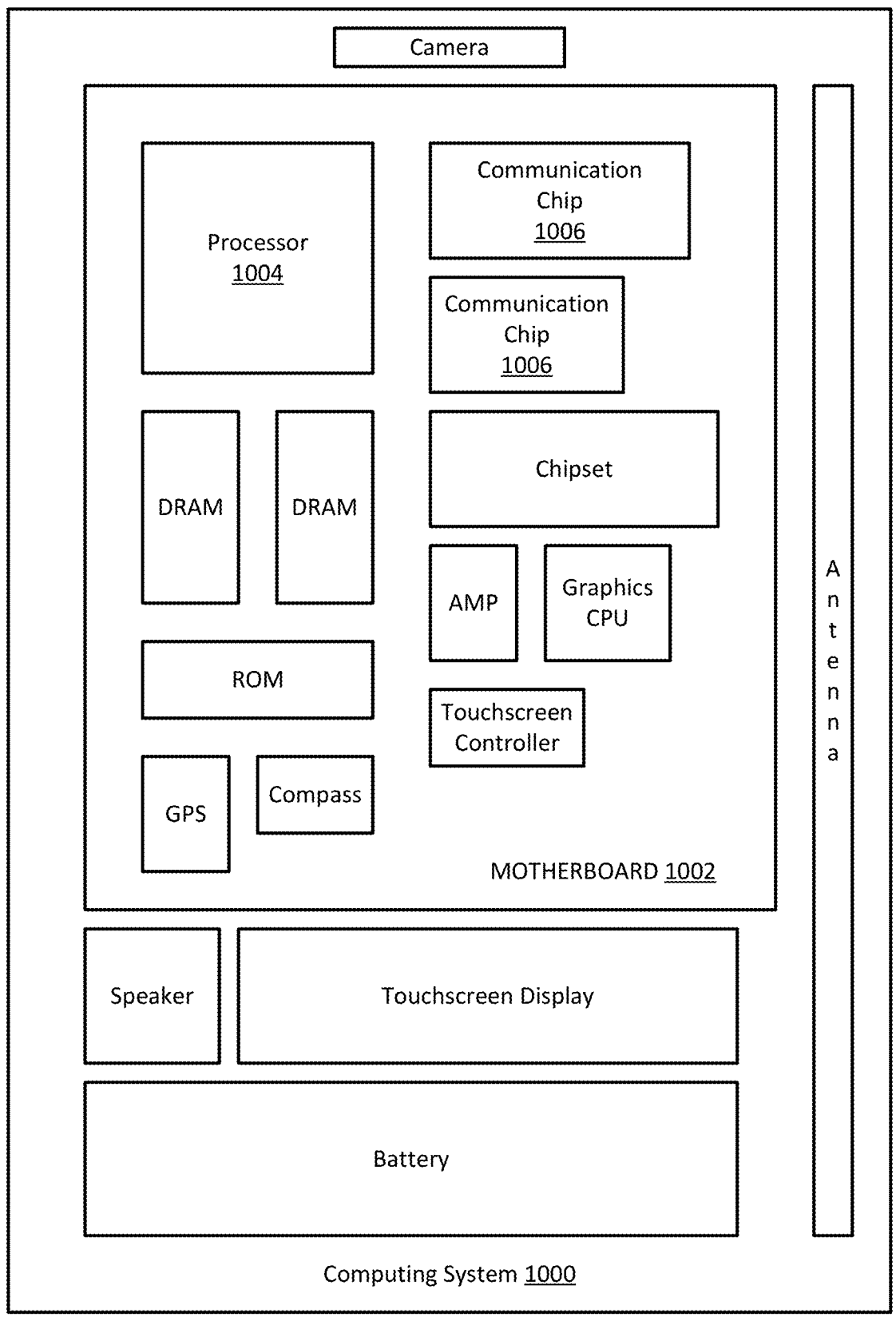
FIG. 4 illustrates a computing system implemented with integrated circuit structures and/or transistor devices formed using the techniques disclosed herein, in accordance with some embodiments of the present disclosure.

FIG. 4 illustrates a computing system 1000 implemented with integrated circuit structures and/or transistor devices formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1 is an integrated circuit (IC) including at least one transistor, the IC including: a channel region including monocrystalline group IV semiconductor material that includes at least 50% germanium by atomic percentage; a gate structure at least above the channel region; a source region adjacent the channel region, the source region including monocrystalline silicon germanium that includes at least 10% less germanium by atomic percentage than the channel region; and a drain region adjacent the channel region.

Example 2 includes the subject matter of Example 1, wherein the channel region includes monocrystalline silicon germanium having at least 80% germanium by atomic percentage.

Example 3 includes the subject matter of Example 1, wherein the channel region essentially consists of monocrystalline germanium.

Example 4 includes the subject matter of any of Examples 1-3, wherein the source region further includes carbon.

Example 5 includes the subject matter of any of Examples 1-4, wherein the drain region includes monocrystalline silicon germanium that includes at least 50% silicon by atomic percentage and also includes at least 10% less germanium by atomic percentage than the channel region.

Example 6 includes the subject matter of Example 5, wherein the drain region further includes carbon.

Example 7 includes the subject matter of any of Examples 1-6, wherein the source region further includes tin in a concentration of 5 to 6% by atomic percentage.

Example 8 includes the subject matter of Example 7, wherein the tin is only included in a portion of the source region between the channel region and another portion of the source region, the portion of the source region also between the other portion of the source region and a substrate, and wherein the tin is not included in the other portion of the source region.

Example 9 includes the subject matter of Example 8, wherein the portion of the source region includes a thickness of at least 10 nanometers between the channel region and the other portion of the source region.

Example 10 includes the subject matter of Example 7, wherein the tin is included in at least a majority of the source region.

Example 11 includes the subject matter of any of Examples 1-10, wherein the monocrystalline silicon germanium includes at least 50% silicon by atomic percentage.

Example 12 includes the subject matter of any of Examples 1-11, wherein the monocrystalline silicon germanium is n-type doped.

Example 13 includes the subject matter of any of Examples 1-12, wherein the monocrystalline silicon germanium includes at least 20% less germanium by atomic percentage than the channel region.

Example 14 includes the subject matter of any of Examples 1-13, wherein the at least one transistor includes at least one of a finned, tri-gate, double-gate, finned field-effect transistor (FinFET), nanowire, nanoribbon, and gate-all-around (GAA) configuration.

Example 15 includes the subject matter of any of Examples 1-14, wherein the at least one transistor is one of a metal-oxide-semiconductor field-effect transistor (MOSFET), a tunnel field-effect transistor (TFET), and a fermi-filter field-effect transistor (FFFET).

Example 16 includes the subject matter of any of Examples 1-15, wherein the at least one transistor includes an n-channel configuration.

Example 17 is a computing system including the subject matter of any of Examples 1-16.

Example 18 is an integrated circuit (IC) including at least one transistor, the IC including: a channel region including monocrystalline group IV semiconductor material that includes at least 50% germanium by atomic percentage; a gate structure at least above the channel region; a source region adjacent the channel region, the source region including tin and also including at least one of silicon and germanium; and a drain region adjacent the channel region.

Example 19 includes the subject matter of Example 18, wherein the channel region includes monocrystalline silicon germanium having at least 80% germanium by atomic percentage.

Example 20 includes the subject matter of Example 18, wherein the channel region essentially consists of monocrystalline germanium.

Example 21 includes the subject matter of any of Examples 18-20, wherein the source region further includes carbon.

Example 22 includes the matter of any of Examples 18-21, wherein the drain region also includes tin and further includes subject at least one of silicon and germanium.

Example 23 includes the subject matter of Example 22, wherein the drain region further includes carbon.

Example 24 includes the subject matter of any of Examples 18-23, wherein the source region includes both silicon and germanium.

Example 25 includes the subject matter of any of Examples 18-24, wherein the source region is n-type doped.

Example 26 includes the subject matter of any of Examples 18-25, wherein the tin is only included in a portion of the source region between the channel region and another portion of the source region, the portion of the source region also between the other portion of the source region and a substrate, and wherein the tin is not included in the other portion of the source region.

Example 27 includes the subject matter of Example 26, wherein the portion of the source region includes a thickness of at least 10 nanometers between the channel region and the other portion of the source region.

Example 28 includes the subject matter of any of Examples 18-27, wherein the tin is included in at least a majority of the source region.

Example 29 includes the subject matter of any of Examples 18-28, wherein the source region includes monocrystalline silicon germanium that includes at least 20% less germanium by atomic percentage than the channel region.

Example 30 includes the subject matter of any of Examples 18-29, wherein the source region includes monocrystalline silicon germanium that includes at least 50% silicon by atomic percentage.

Example 31 includes the subject matter of any of Examples 18-30, wherein the at least one transistor includes at least one of a finned, tri-gate, double-gate, finned field-effect transistor (FinFET), nanowire, nanoribbon, and gate-all-around (GAA) configuration.

Example 32 includes the subject matter of any of Examples 18-31, wherein the at least one transistor is one of a metal-oxide-semiconductor field-effect transistor (MOSFET), a tunnel field-effect transistor (TFET), and a fermi-filter field-effect transistor (FFFET).

Example 33 includes the subject matter of any of Examples 18-32, wherein the at least one transistor is an n-channel metal-oxide-semiconductor field-effect transistor (n-MOS) device.

Example 34 is a mobile computing system including the subject matter of any of Examples 18-33.

Example 35 is a method of forming an integrated circuit (IC) including at least one transistor, the method including: forming a channel region including monocrystalline group IV semiconductor material that includes at least 50% germanium by atomic percentage; forming a gate structure at least above the channel region; forming a source region adjacent the channel region, the source region including monocrystalline silicon germanium that includes at least 10% less germanium by atomic percentage than the channel region; and forming a drain region adjacent the channel region.

Example 36 includes the subject matter of Example 35, wherein the channel region includes monocrystalline silicon germanium having at least 80% germanium by atomic percentage.

Example 37 includes the subject matter of Example 35, wherein the channel region essentially consists of monocrystalline germanium.

Example 38 includes the subject matter of any of Examples 35-37, wherein the source region further includes carbon.

Example 39 includes the subject matter of any of Examples 35-38, wherein the drain region includes monocrystalline silicon germanium that includes at least 50% silicon by atomic percentage and also includes at least 10% less germanium by atomic percentage than the channel region.

Example 40 includes the subject matter of Example 39, wherein the drain region further includes carbon.

Example 41 includes the subject matter of any of Examples 35-40, wherein the source region further includes tin in a concentration of 5 to 6% by atomic percentage.

Example 42 includes the subject matter of Example 41, wherein the tin is only included in a portion of the source region between the channel region and another portion of the source region, the portion of the source region also between the other portion of the source region and a substrate, and wherein the tin is not included in the other portion of the source region.

Example 43 includes the subject matter of Example 42, wherein the portion of the source region includes a thickness of at least 10 nanometers between the channel region and the other portion of the source region.

Example 44 includes the subject matter of Example 41, wherein the tin is included in at least a majority of the source region.

Example 45 includes the subject matter of any of Examples 35-44, wherein the monocrystalline silicon germanium includes at least 50% silicon by atomic percentage.

Example 46 includes the subject matter of any of Examples 35-45, wherein the monocrystalline silicon germanium is n-type doped.

Example 47 includes the subject matter of any of Examples 35-46, wherein the monocrystalline silicon germanium includes at least 20% less germanium by atomic percentage than the channel region.

Example 48 includes the subject matter of any of Examples 35-47, wherein the gate structure is formed using a gate last process flow employing a dummy gate structure, such that the source and drain regions are formed prior to forming the gate structure.

Example 49 includes the subject matter of Example 48, wherein the channel region is converted to a nanowire structure after the dummy gate structure is removed and prior to forming the gate structure.

Example 50 includes the subject matter of any of Examples 35-47, wherein the gate structure is formed using a gate first process flow, such that the source and drain regions are formed after forming the gate structure.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit (IC), comprising:
a semiconductor region including a first monocrystalline group IV semiconductor material that includes at least 50% germanium by atomic percentage;
a gate structure at least above the semiconductor region;
a source region including a second monocrystalline group IV semiconductor material, the source region laterally adjacent to the semiconductor region, wherein the source region includes carbon alloyed with the second monocrystalline group IV semiconductor material, wherein the carbon is only included in a portion of the source region, the portion of the source region between a remaining portion of the source region and the semiconductor region, and wherein the carbon is not included in the remaining portion of the source region; and a drain region laterally adjacent to the semiconductor region.

2. The IC of claim 1, wherein the semiconductor region includes monocrystalline silicon germanium having at least 80% germanium by atomic percentage.

3. The IC of claim 1, wherein the semiconductor region essentially consists of monocrystalline germanium.

4. The IC of claim 1, wherein the source region includes the carbon at least at an interface between the source region and the semiconductor region.

5. The IC of claim 1, wherein the drain region includes carbon alloyed with monocrystalline group IV semiconductor material.

6. The IC of claim 5, wherein the drain region further includes the carbon at least at an interface between the drain region and the semiconductor region.

7. The IC of claim 1, wherein the source region includes carbon in a concentration of 1% to 5% by atomic percentage.

8. The IC of claim 1, wherein the portion of the source region includes a thickness of at least 10 nanometers between the semiconductor region and the remaining portion of the source region.

9. The IC of claim 1, wherein the carbon is included in at least 50% of the source region.

10. The IC of claim 1, wherein the carbon is included throughout an entirety of the source region.

11. The IC of claim 1, wherein the carbon has a highest concentration at an interface between the source region and the semiconductor region and a lower concentration at any other portion of the source region.

12. The IC of claim 1, wherein the semiconductor region is part of a fin, and the gate structure is on top and side walls of the fin.

13. The IC of claim 1, wherein the semiconductor region includes one or more nanowires or nanoribbons, and the gate structure wraps around the one or more nanowires or nanoribbons.

14. The IC of claim 1, wherein the source and drain regions include n-type dopant.

15. An integrated circuit (IC), comprising:
a non-planar semiconductor region including monocrystalline group IV semiconductor material that includes at least 50% germanium by atomic percentage;
a gate structure at least on top and side surfaces of the non-planar semiconductor region;
a source region adjacent the non-planar semiconductor region, the source region including carbon and also including at least one of silicon and germanium, wherein the carbon is only included in a portion of the source region between the non-planar semiconductor region and another portion of the source region, the portion of the source region also between the other portion of the source region and a substrate, and wherein the carbon is not included in the other portion of the source region; and
a drain region adjacent the non-planar semiconductor region.

16. The IC of claim 15, wherein the carbon has a highest concentration at a first interface between the portion of the source region and the non-planar semiconductor region, and the carbon has a lowest concentration at a second interface between the portion of the source region and the other portion of the source region.

17. An integrated circuit (IC), comprising:
a non-planar semiconductor region including monocrystalline group IV semiconductor material that includes at least 80% germanium by atomic percentage;
a gate structure, the gate structure at least on top and side surfaces of the non-planar semiconductor region, the gate structure including a gate dielectric and a gate electrode, the gate dielectric between the gate electrode and the non-planar semiconductor region;
a source region laterally adjacent the non-planar semiconductor region, the source region including silicon, germanium, and an n-type dopant, wherein the silicon concentration of the source region is greater than any silicon concentration of the semiconductor region; and
a drain region laterally adjacent the non-planar semiconductor region, the drain region including silicon, germanium, and an n-type dopant, wherein the silicon concentration of the drain region is greater than any silicon concentration of the semiconductor region.

18. The IC of claim 17, wherein the source region and the drain region each include carbon at respective interfaces with the semiconductor region, and/or the silicon concentration of each of the source and drain regions is at least 10% greater than any silicon concentration of the semiconductor region.

19. The IC of claim 17, wherein the non-planar semiconductor region includes one or more nanowires or nanoribbons, and the gate structure wraps around the one or more nanowires or nanoribbons.

* * * * *